United States Patent
Choi et al.

(10) Patent No.: US 11,671,059 B2
(45) Date of Patent: Jun. 6, 2023

(54) DEVICE AND METHOD FOR COMPENSATING FOR NONLINEARITY OF POWER AMPLIFIER

(71) Applicant: SAMSUNG ELECTRONICS CO., LTD., Suwon-si (KR)

(72) Inventors: Hongmin Choi, Seoul (KR); Junse Lee, Seoul (KR); Hyunseok Yu, Seoul (KR); Youngik Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/645,076

(22) Filed: Dec. 20, 2021

(65) Prior Publication Data

US 2022/0115991 A1  Apr. 14, 2022

Related U.S. Application Data

(63) Continuation of application No. 16/833,771, filed on Mar. 30, 2020, now Pat. No. 11,251,755.

(30) Foreign Application Priority Data

Jul. 10, 2019 (KR) ........................ 10-2019-0083441

(51) Int. Cl.
*H04K 1/02* (2006.01)
*H04L 25/03* (2006.01)
(Continued)

(52) U.S. Cl.
CPC .......... *H03F 1/3258* (2013.01); *H03F 3/189* (2013.01); *H03F 3/24* (2013.01); *H04B 1/0475* (2013.01); *H03F 2201/3224* (2013.01)

(58) Field of Classification Search
CPC .......... H03F 1/3258; H03F 3/24; H03F 3/189; H03F 2201/3224; H03F 1/3252; H04B 1/0475
(Continued)

(56) References Cited

U.S. PATENT DOCUMENTS 7,999,614 B1  8/2011  Ai et al.
8,989,307 B2  3/2015  Zhou et al.
(Continued)

FOREIGN PATENT DOCUMENTS

| JP | 2001-268150 | 9/2001 |
|---|---|---|
| KR | 10-2012-0054369 | 5/2012 |
| KR | 10-2014-0077742 | 6/2014 |

*Primary Examiner* — Phuong Phu
(74) *Attorney, Agent, or Firm* — F. Chau & Associates, LLC

(57) ABSTRACT

A device configured to perform wireless communication includes: a pre-distortion circuit configured to generate a pre-distorted input signal by performing pre-distortion on an input signal based on a parameter set comprising a plurality of coefficients; a power amplifier configured to generate an output signal by amplifying an RF signal based on the pre-distorted input signal; and a parameter obtaining circuit configured to obtain second memory polynomial modeling information corresponding to an operating frequency band based on first memory polynomial modeling information corresponding to each of a plurality of frequency sections and obtain a parameter set according to an indirect learning structure by using the second memory polynomial modeling information.

18 Claims, 14 Drawing Sheets

(51) Int. Cl.
  *H04L 25/49* (2006.01)
  *H03F 1/32* (2006.01)
  *H03F 3/24* (2006.01)
  *H04B 1/04* (2006.01)
  *H03F 3/189* (2006.01)

(58) Field of Classification Search
  USPC ........ 375/296, 297, 295, 229, 230, 231, 232
  See application file for complete search history.

(56) References Cited

U.S. PATENT DOCUMENTS

| | | |
|---|---|---|
| 9,590,668 B1 | 3/2017 | Kim et al. |
| 9,787,335 B1 | 10/2017 | Jeong et al. |
| 10,749,480 B2 | 8/2020 | Tanio et al. |
| 2006/0276146 A1* | 12/2006 | Suzuki .................. H03F 1/3252 |
| | | 455/114.3 |
| 2021/0013844 A1 | 1/2021 | Choi et al. |

\* cited by examiner

DEVICE AND METHOD FOR COMPENSATING FOR NONLINEARITY OF POWER AMPLIFIER

CROSS-REFERENCE TO RELATED APPLICATIONS

This application is a continuation of U.S. patent application Ser. No. 16/833,771, filed Mar. 30, 2020, which claims the benefit of Korean Patent Application No. 10-2019-0083441, filed on Jul. 10, 2019, in the Korean Intellectual Property Office, the disclosures of which are incorporated herein by reference in their entireties.

TECHNICAL FIELD

This disclosure relates generally to a device and method for compensating for nonlinearity of a power amplifier, such as a power amplifier of a wireless communication device.

DISCUSSION OF THE RELATED ART

Devices for wireless communication may include transmitters providing radio frequency (RF) signals that are output to antennas. A transmitter may include components for generating the RF signals from baseband signals, such as a mixer for upconverting the baseband signals to RF signals, one or more filters, and an RF power amplifier. When the baseband signals are processed by the components of the transmitter, the RF signals may become distorted due to characteristics of the components. For example, the power amplifier in particular may exhibit nonlinear gain and phase as a function of input signal power, and this nonlinearity may degrade communication quality by distorting the RF output signals. In the case of digital baseband signals, distortion due to operation in a gain compression region of the power amplifier may lead to excessive bit errors particularly for bits represented by relatively higher power signals. To reduce distortion, a digital pre-distortion or RF pre-distortion technique may be used to pre-distort the input RF signal to the power amplifier in a complementary manner to the power amplifier characteristics. However, at higher RF frequencies and in the presence of a plurality of antenna elements of an antenna array (where mutual coupling may affect the power amplifiers), the RF signal distortion may be exacerbated and may be more difficult to compensate using a pre-distortion method.

SUMMARY

Embodiments of the inventive concept provides a device and method for compensating for nonlinearity of a power amplifier, and more particularly, a device and method for adaptively performing pre-distortion on various frequency bands while reducing a storage space of a memory used for the pre-distortion.

According to an aspect of the inventive concept, there is provided a device configured to perform wireless communication including: a pre-distortion circuit configured to generate a pre-distorted input signal by performing pre-distortion on an input signal based on a parameter set including a plurality of coefficients; a power amplifier configured to generate an output signal by amplifying an RF signal based on the pre-distorted input signal; and a parameter obtaining circuit configured to obtain second memory polynomial modeling information corresponding to an operating frequency band based on first memory polynomial modeling information corresponding to each of a plurality of frequency sections and obtain a parameter set according to an indirect learning structure by using the second memory polynomial modeling information.

According to another aspect of the inventive concept, there is provided a method of processing a signal of a device, the method including: determining at least one frequency section including at least a portion of an operating frequency band of the device among a plurality of frequency sections that are divided from an entire frequency band over which the device is configured to operate; obtaining an auto-correlation vector corresponding to the operating frequency band and a cross-correlation matrix corresponding to the operating frequency band, based on a frequency section information corresponding to the determined at least one frequency section; and generating an output signal by performing pre-distortion on an input signal by using a coefficient matrix that is obtained based on the auto-correlation matrix corresponding to the operating frequency band and the cross-correlation vector corresponding to the operating frequency band.

According to another aspect of the inventive concept, there is provided a device configured to perform wireless communication, the device including: a memory configured to store a plurality of pieces of frequency section information for a plurality of frequency sections and instructions for operation of the device; a processor configured to perform pre-distortion on an input signal in a given frequency band by executing at least one instruction among the instructions stored in the memory and generate the pre-distorted input signal; and a power amplifier configured to generate an output signal by amplifying the pre-distorted input signal, wherein the processor is configured to determine at least one frequency section including at least a portion of the given frequency band among the plurality of frequency sections and perform a pre-distortion calculation on the input signal by using a coefficient matrix obtained by using frequency section information corresponding to the determined at least one frequency section among the plurality of pieces of frequency section information.

According to another aspect of the inventive concept, there is provided a method of performing a pre-distortion calculation on an input signal of a frequency band spanning over a first frequency section and a second frequency section, performed by a device, the method including: obtaining a first auto-correlation matrix corresponding to the first frequency section, a second auto-correlation matrix corresponding to the second frequency section, and an auto-correlation matrix corresponding to the frequency band based on a center frequency of the frequency band; obtaining a first cross-correlation vector corresponding to the first frequency section, a second cross-correlation vector corresponding to the second frequency section, and a cross-correlation vector corresponding to the frequency band based on the center frequency of the frequency band; and performing pre-distortion on the input signal by using the coefficient matrix obtained based on the obtained auto-correlation matrix and the obtained cross-correlation vector.

According to another aspect of the inventive concept, there is provided a device configured to perform wireless communication, the device including: a memory configured to store a plurality of pieces of frequency section information for each of a plurality of frequency sections divided in an entire frequency band over which the device is configured to operate; a processor configured to generate a pre-distorted input signal by performing pre-distortion on an input signal in a given frequency band; and an amplifier configured to generate an output signal based on the pre-distorted input signal provided by the processor, wherein the processor is configured to, when the given frequency band spans over a first frequency section and a second frequency section among the plurality of frequency sections, perform the pre-distortion on the input signal by using a coefficient matrix obtained based on a first frequency section information corresponding to the first frequency section and a second frequency section information corresponding to the second frequency section, and when the given frequency band spans over a third frequency section and a fourth frequency section among the plurality of frequency sections, perform the pre-distortion on the input signal by using a coefficient matrix obtained based on third frequency section information corresponding to the third frequency section and fourth frequency section information corresponding to the fourth frequency section.

According to another aspect of the inventive concept, there is provided a device configured to perform wireless communication, the device including: a memory configured to store a plurality of pieces of memory polynomial modeling information corresponding to each of a plurality of frequency sections divided from an entire frequency band over which the device is configured to operate; and a processor configured to obtain second memory polynomial modeling information corresponding to an operating frequency band by using at least one piece of first memory polynomial modeling information corresponding to at least one first frequency section including at least a portion of the operating frequency band of the plurality of frequency sections among the plurality of pieces of memory polynomial modeling information, and generate a pre-distorted input signal by performing pre-distortion on an input signal by using a parameter set obtained by using the second memory polynomial modeling information.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Hereinafter, embodiments of the inventive concept are described in detail with reference to the accompanying drawings.

Figure 1:
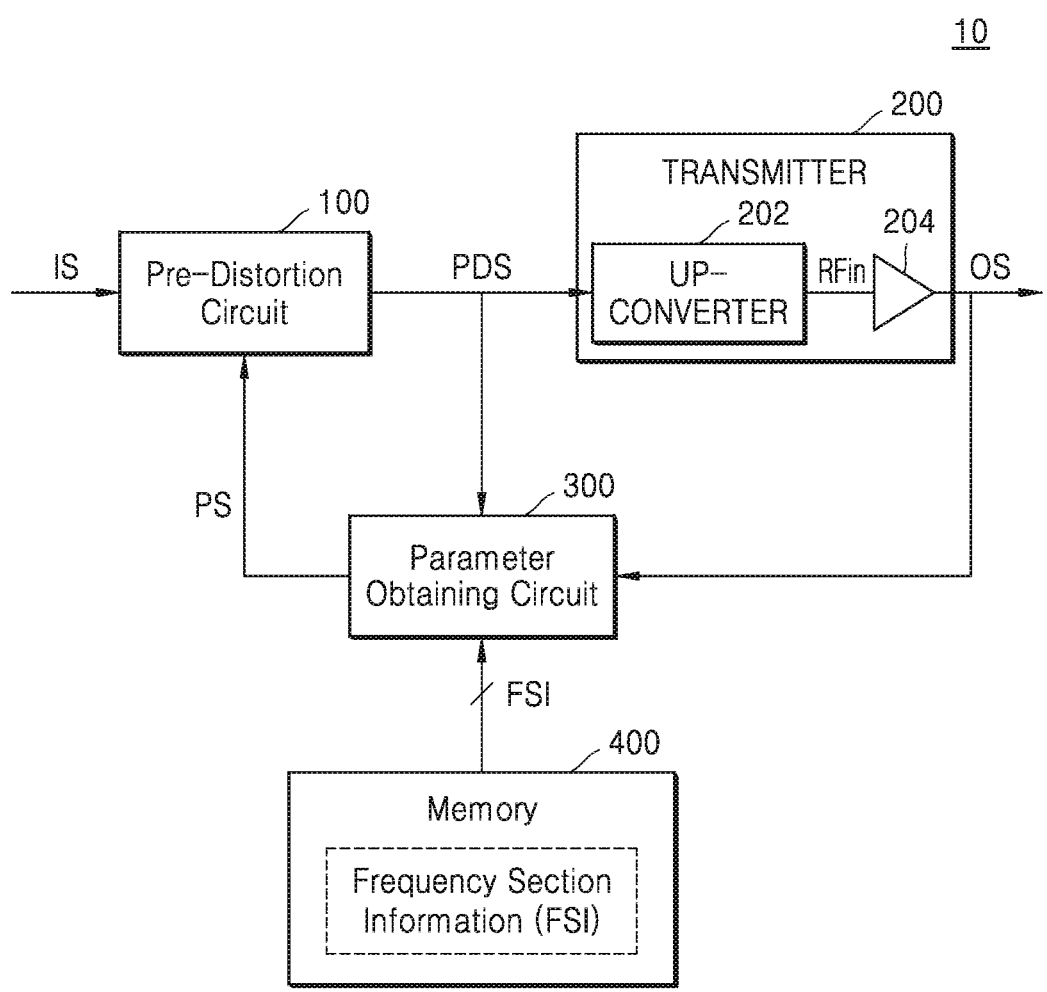
FIG. 1 illustrates a device according to an example embodiment of the inventive concept.

FIG. 1 illustrates a device 10 according to an example embodiment of the inventive concept. The device 10 may comprise a pre-distortion circuit 100, a transmitter 200, and a parameter obtaining circuit 300. The device 10 may be a communication device, typically a wireless communication device. The device 10 may be a base station or user equipment included in a wireless communication system. The wireless communication system may be, as non-limiting examples, a wireless communication system using a cellular network such as a 5th generation (5G) wireless system, a long term evolution (LTE) system, an LTE-advanced system, a code division multiple access (CDMA) system, a global system for mobile communications (GSM) system, or any other wireless communication system such as wireless local area network (WLAN), WiFi, and Bluetooth. The base station may be referred to as a Node B, an evolved-Node B (eNB), a sector, a site, a base transceiver system (BTS), an access point (AP), a relay node, and a remote radio head (RRH), a radio unit (RU), a small cell, etc. The user equipment may be referred to as terminal equipment, a mobile station (MS), a mobile terminal (MT), a user terminal (UT), a subscriber station (SS), a wireless device, a handheld device, etc. The device 10 may further include various components in addition to the components illustrated in FIG. 1.

The transmitter 200 may process a baseband pre-distorted signal PDS and generate an RF output signal OS. For example, the transmitter 200 may include an upconverter 202 for upconverting the pre-distorted signal PDS to an input RF signal RFin, and a power amplifier 204 that amplifies the signal RFin to generate the output signal OS. Herein, the input RF signal RFin may be referred to as a pre-distorted RF signal, and may be referred to as an RF signal that is based on the pre-distorted signal PDS. The transmitter 200 and/or the pre-distortion circuit 100 may also include various filters (not shown) such as a low pass filter to smooth out inter-symbol transitions.

In general, linear characteristics may be required for output characteristics of the power amplifier 204, but the power amplifier 204 may have nonlinear characteristics due to characteristics of the power amplifier 204 itself or various peripheral factors. In other words, as illustrated in FIG. 2, the output characteristics of the power amplifier 204 may exhibit nonlinear characteristics.

Figure 2:
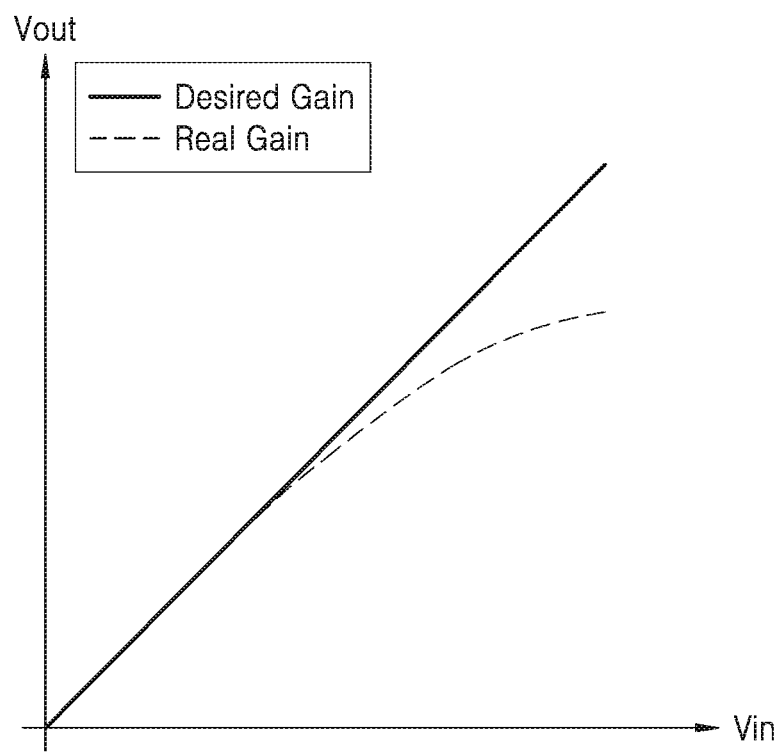
FIG. 2 illustrates example input-output characteristics of a power amplifier.

FIG. 2 illustrates example input-output characteristics of the power amplifier 204.

A solid line may represent characteristics of a desired gain for the power amplifier 204. As illustrated in FIG. 2, the characteristic of the desired gain may represent characteristics in which an input voltage is proportional to an output voltage.

However, an actual gain of the power amplifier 204 may exhibit the same characteristics as a dashed line in FIG. 2. In other words, the actual gain characteristics of the power amplifier 204 may represent the nonlinear characteristics in which the input voltage and the output voltage are not proportional to each other in a particular region.

Referring further to FIG. 1, the pre-distortion may be used to compensate for the nonlinearity of the power amplifier 204. The pre-distortion may be referred to as a technique of pre-distorting the input signal IS according to characteristics complementary to the nonlinearity of the power amplifier 204.

For example, the pre-distortion circuit 100 may generate a baseband pre-distorted signal PDS by performing the pre-distortion on the input signal IS. The pre-distortion circuit 100 may provide the pre-distorted signal PDS to the transmitter 200. The power amplifier 204 may generate the output signal OS by amplifying the pre-distorted RF signal RFin. As the pre-distortion circuit 100 performs the pre-distortion on the input signal IS, the nonlinearity of the power amplifier 204 may be compensated for. In an embodiment, the pre-distortion circuit 100 may perform a digital pre-distortion on the input signal IS.

In an embodiment, the pre-distortion circuit 100 may perform the pre-distortion on the input signal IS based on a parameter set PS. The parameter set PS may be provided by the parameter obtaining circuit 300. The parameter set PS may include a plurality of coefficients used for the pre-distortion.

Here, the input signal IS and the pre-distorted signal PDS may be digital signals such as a phase shift keyed (PSK) signal, a quadrature amplitude modulation signal (QAM signal), and so forth. The output signal OS may be referred to as a modulated digital signal.

The pre-distortion circuit 100 may be modeled by using a polynomial as shown in Formula 1 below. Here, the polynomial modeling may be referred to as a memory polynomial modeling. In Formula 1, x(n) represents a sample of the input signal IS, z(n) represents a sample of the pre-distorted signal PDS, $a_q$ represents a coefficient used for the pre-distortion, and Q represents a nonlinear order.

$$z(n) = \sum_{q=0}^{Q-1} a_q x(n)|x(n)|^q \qquad \text{[Formula 1]}$$

The pre-distortion circuit 100 may be implemented in various forms. According to an embodiment, the pre-distortion circuit 100 may be implemented by hardware or software. When the pre-distortion circuit 100 is implemented by hardware, the pre-distortion circuit 100 may include circuits for performing the pre-distortion on the input signal IS. When the pre-distortion circuit 100 is implemented by software, the pre-distortion may be performed by executing programs and/or instructions loaded into the memory 400, by a processor (500 in FIG. 3) or any processor in the device 10. In other examples, the pre-distortion circuit 100 may be implemented by a combination of software and hardware such as firmware.

The parameter obtaining circuit 300 may obtain the parameter set PS based on the pre-distorted signal PDS and output signal OS and may provide the generated parameter set PS to the pre-distortion circuit 100.

In an embodiment, the parameter obtaining circuit 300 may obtain the parameter set PS including a plurality of coefficients based on an indirect learning structure. The indirect learning structure may represent a learning structure in which a difference between an intermediate signal obtained from the output signal OS and the pre-distorted signal PDS is minimized, instead of a difference between the input signal IS and the output signal OS. When y(n) represents a sample of the output signal OS, w(n) represents a sample of the intermediate signal, $a_{kq}$ represents a coefficient, Q represents the nonlinear order, and K represents a memory depth, the intermediate signal may be a signal obtained by using a polynomial formula such as Formula 2 below.

$$w(n) = \sum_{k=0}^{K-1} \sum_{q=0}^{Q-1} a_{kq} y(n-k)|y(n-k)|^q \qquad \text{[Formula 2]}$$

The parameter obtaining circuit 300 may obtain the parameter set PS that reduces the difference between the intermediate signal obtained as described above based on the output signal OS and the pre-distorted signal PDS, by using the indirect learning structure. In an embodiment, the parameter obtaining circuit 300 may obtain the parameter set PS that minimizes a mean squared error (MSE) between the intermediate signal and the pre-distorted signal PDS. When z(n) represents a sample of the pre-distorted signal PDS, w(n) represents a sample of the intermediate signal, and e(n) represents a sample of an error signal, the MSE may be obtained by using Formula 3 below.

$$\text{MSE} = E[e^2(n)] = E[|z(n) - w(n)|^2] \qquad \text{[Formula 3]}$$

Factors that minimize the MSE may be obtained by using the Wiener filter. In other words, the parameter obtaining circuit 300 may obtain the parameter sets PS including the coefficients $a_{kq}$ that minimize the MSE by applying the Wiener filter. In this case, as the Wiener filter is applied, a procedure of obtaining coefficients that minimize the MSE may involve solving a matrix equation in Formula 4 below. In Formula 4, y(n) represents a sample of the output signal OS, z(n) represents a sample of the pre-distorted signal PDS, Q represents the nonlinear order, and K represents the memory depth.

$$Ax = b$$

$$(A = E[Y(n)Y^H(n)], x = [a_{00}\ a_{01}\ a_{02} \ldots a_{K-1Q-1}]^T, b = E[Y(n)z^H(n)],$$

$$Y(n) = [y(n), y(n)|y(n)|, \ldots\ y(n)|y(n)|^{Q-1}, y(n-1), \ldots y(n-K+1)|y(n-K+1)|^{Q-1}]^T \qquad \text{[Formula 4]}$$

In Formula 4, a matrix with T as a superscript denotes a transposed matrix. A matrix with H as a superscript is a Hermitian matrix, which is a matrix obtained by transposing after conjugates are applied to all elements of the matrix. In other words, the matrix with H as a superscript is a conjugate transposed matrix. E [ ]represents an expectation of a value included therein. Y(n) may be a KQ×1 matrix in which an element corresponding to an $i*j^{th}$ row and a first column has a value as shown in Formula 5 below.

$$Y(n)[i*j,1]=y(n-i+1)|y(n-i+1)|^{j-1} \quad \text{[Formula 5]}$$

Here, x may be a KQ*1 matrix in which an element corresponding to the $i*j^{th}$ row and the first column has a value in Formula 6 below.

$$x[i*j,1]=a_{(i-1)(j-1)} \quad \text{[Formula 6]}$$

As a result, the matrix A used in a method of applying the Wiener filter may be a KQ×KQ matrix, and the matrix b may be a KQ×1 matrix. In other words, the matrix b may be a vector having KQ elements. Hereinafter, for convenience of description, in the method of applying the Wiener filter to Formula 4, the matrix A used in the equivalent matrix equation may be referred to as an auto-correlation matrix, and the matrix b may be referred to as a cross-correlation vector. In addition, the matrix x including the coefficients may be referred to as a coefficient matrix. In other words, obtaining the parameter set PS may include obtaining the coefficient matrix b by obtaining a solution of the matrix equation of Formula 4. In this manner, the auto-correlation matrix and the cross-correlation vector required for obtaining the coefficient matrix may be referred to as "memory polynomial modeling information" (interchangeably, just "polynomial modeling information"), which may be information based on signal measurements and subsequent calculations using the measurement results, which information may be stored in the memory 400 within the device 10.

With regard to frequencies of operation, the operating frequency band may vary depending on a type or set-up of the device 10. For example, a center frequency and a frequency bandwidth of the operating frequency band that are set for the device 10's operation may vary. When the operating frequency band is changed, the memory polynomial modeling information required for obtaining the coefficient matrix x from the parameter obtaining circuit 300 may vary according to characteristics of the power amplifier 204. In other words, without implementation of the inventive concept taught herein, the device 10 may need to store the memory polynomial modeling information for each of the possible frequency bands to provide highly reliable pre-distortion. However, storing all of the memory polynomial modeling information for each of the possible frequency bands may cause a requirement of a large memory storage space. On the other hand, with embodiments described herein, a method of performing the pre-distortion for the various frequency bands may be implemented by using a smaller memory storage space.

The parameter obtaining circuit 300 according to an example embodiment of the inventive concept may use frequency section information FSI for a plurality of frequency bands that are pre-divided in an entire frequency band over which the device 10 is configured to operate, for obtaining the memory polynomial modeling information corresponding to the given (operating) frequency band. The frequency section information FSI may be stored in the memory 400. Herein, the term 'given frequency band' may be a term to represent the operating frequency band that is currently allocated for an operation of the device 10. A "given frequency band" may be interchangeably referred to as a sub-band or a channel of the entire frequency band. There may be many given frequency bands possible within an entire frequency band of operation of the device 10.

To this end, the device 10 may divide the entire frequency band into a plurality of frequency sections, and after the polynomial modeling information corresponding to each of the plurality of frequency sections is obtained, may generate the polynomial modeling information corresponding to each of the plurality of frequency sections and the frequency section information FSI including the center frequency of each of the plurality of frequency sections, and the memory 400 may generate the frequency section information FSI. The plurality of frequency sections are described in more detail with reference to FIGS. 4, 15, and 16, and the frequency section information FSI is described in detail with reference to FIG. 7. A number "N" of frequency sections may be smaller than a number "M" of permissible given frequency bands within the entire frequency band over which the device 10 is configured to operate. Instead of separately measuring and calculating polynomial modeling information for each given frequency band, this information may be obtained through calculation based on the polynomial modeling information for one or more of the frequency sections that overlap the given frequency band. Thus, by obtaining the polynomial modeling information for the smaller number N of frequency sections, the amount of measurements and computations performed beforehand to cover all permissible given frequency bands, and/or the amount of memory space used to store the information, may be reduced.

According to an embodiment, the parameter obtaining circuit 300 may determine at least one frequency section including at least a portion of a given frequency band among the plurality of frequency sections and may obtain the polynomial modeling information corresponding to the frequency band that is provided based on the frequency section information FSI corresponding to the determined at least one frequency section.

For example, the parameter obtaining circuit 300 may obtain the auto-correlation matrix corresponding to the determined at least one frequency section, the center frequency corresponding to the determined at least one frequency section, and the auto-correlation matrix corresponding to the frequency band that is given based on the center frequency of the given frequency band. In addition, the parameter obtaining circuit 300 may obtain the cross-correlation vector corresponding to the determined at least one frequency section, the center frequency corresponding to the determined at least one frequency section, and the cross-correlation vector corresponding to the frequency band that is given based on the center frequency of the given frequency band. The parameter obtaining circuit 300 may obtain the coefficient matrix based on the obtained auto-correlation matrix and the obtained cross-correlation vector and may output the coefficient matrix or coefficients included in the coefficient matrix as the parameter set PS. For example, the parameter obtaining circuit 300 may obtain the coefficient matrix by performing a calculation of multiplying the cross-correlation vector by an inverse matrix of the obtained auto-correlation matrix. Alternatively, in an embodiment, the parameter obtaining circuit 300 may obtain the coefficient matrix by performing an iterative approximation calculation using the obtained auto-correlation matrix and the obtained cross-correlation vector, and in this case, an embodiment in which the parameter obtaining circuit 300 uses a conjugate gradient method may be also applicable.

A method of obtaining the polynomial modeling information corresponding to the given frequency band based on the frequency section information FSI about the plurality of frequency sections, for example, a method of obtaining the auto-correlation matrix and the cross-correlation vector corresponding to the given frequency band by using the parameter obtaining circuit 300 is described in detail with reference to the following drawings.

The parameter obtaining circuit 300 may be implemented in various forms, and according to an embodiment, the parameter obtaining circuit 300 may be implemented by hardware or software. When the parameter obtaining circuit 300 is implemented by hardware, the parameter obtaining circuit 300 may include circuits for generating the parameter set PS based on the output signal OS and the pre-distorted signal PDS. In addition, for example, when the parameter obtaining circuit 300 is implemented by software, as illustrated in FIG. 2, the parameter set PS may be generated by executing programs and/or instructions loaded into the memory 400 by using the processor (500 in FIG. 3) or any processor in the device 10. However, the embodiment is not limited thereto, and the parameter obtaining circuit 300 may be implemented by a combination of software and hardware, such firmware.

The memory 400 may be a storage area for storing data and may store, for example, an operating system (OS), various programs, and various data. The memory 400 may include at least one of a volatile memory and a non-volatile memory. The non-volatile memory may include read-only memory (ROM), programmable ROM (PROM), electrically programmable ROM (EPROM), electrically erasable PROM (EEPROM), a flash memory, phase-change random-access memory (RAM) (PRAM), magnetic RAM (MRAM), resistive RAM (RRAM), ferroelectric RAM (FRAM), etc. The volatile memory may include dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), etc. In addition, in an embodiment, the memory 400 may include at least one of a hard disk drive (HDD), a solid state drive (SSD), a compact flash (CF) memory, a secure digital (SD) memory, a micro secure digital Secure digital), memory an extreme digital (xD) memory, or a memory stick. In an embodiment, the memory 400 may semi-permanently or temporarily store programs and a plurality of instructions that are executed by the processor (500 in FIG. 3). In addition, the memory 400 may store various information or data used for calculations or operations of the processor (500 in FIG. 3).

According to the device 10 according to an example embodiment of the inventive concept, as the parameter obtaining circuit 300 obtains the memory polynomial modeling information such as the auto-correlation matrix or cross-correlation vector used for obtaining the coefficient matrix based on the frequency section information FSI about the plurality of frequency sections, the amount of data to be stored by the memory 400 may be reduced. In other words, the storage space of the memory 400 used or required to perform the pre-distortion in the device 10 may be reduced.

In addition, since the device 10 according to an example embodiment of the inventive concept is adaptively capable of performing the pre-distortion in various given frequency bands given over a wide frequency band by using only a small amount of storage space in the memory 400, the reliability of the wireless communication of the device 10 may also be improved.

Figure 3:
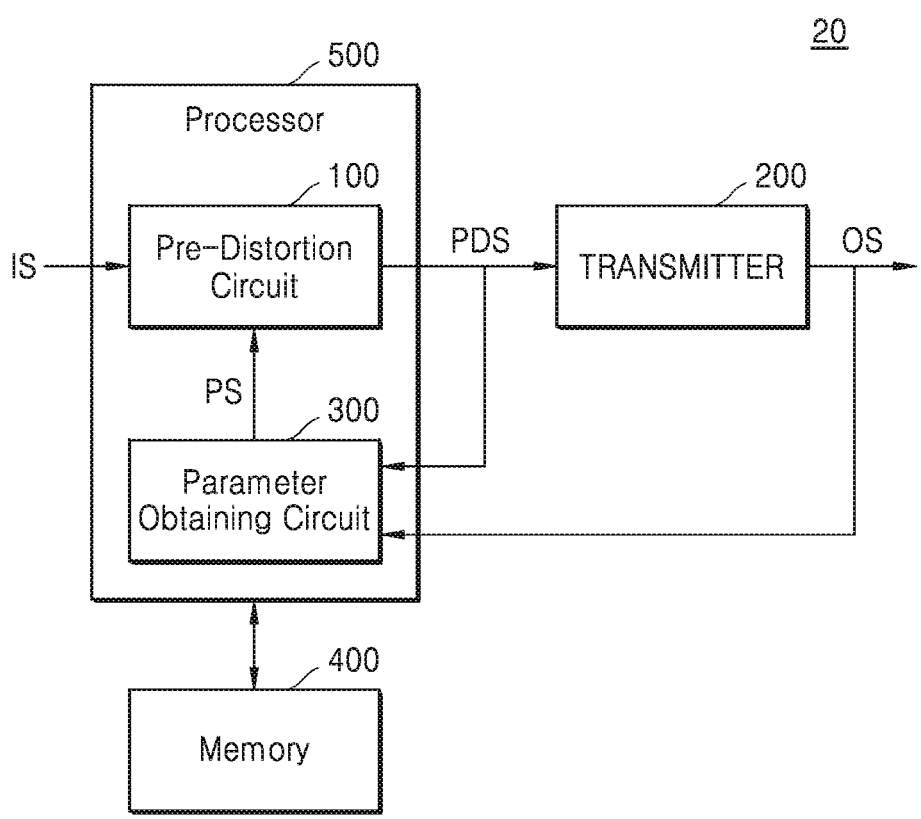
FIG. 3 illustrates a device according to an example embodiment of the inventive concept.

FIG. 3 illustrates a device 20 according to an example embodiment of the inventive concept. In particular, FIG. 3 is a diagram of an implementation example of the pre-distortion circuit 100, the transmitter 200, the parameter obtaining circuit 300, and the memory 400, which have been illustrated in FIG. 1. Redundant descriptions of the pre-distortion circuit 100, the transmitter 200, the parameter obtaining circuit 300, and the memory 400 in FIG. 3 that have been already given with reference to FIG. 1, are omitted.

The device 20 may include the transmitter 200, the memory 400, and the processor 500, and the processor 500 may include the pre-distortion circuit 100 and the parameter obtaining circuit 300.

The processor 500 may control the entire operation of the device 10, and for example, the processor 500 may be a central processing unit (CPU). The processor 500 may include only a single processor core or alternatively a plurality of processor cores ("multi-core"). The processor 500 may process or execute programs and/or data stored in the memory 400. In an embodiment, the processor 500 may control various functions or perform various calculations of the device 20 by executing programs stored in the memory 400.

The processor 500 according to an example embodiment of the inventive concept may generate the pre-distorted signal PDS by performing the pre-distortion on the input signal IS. In an embodiment, the processor 500 may obtain the memory polynomial modeling information corresponding to the given frequency band based on frequency section information FSI of the plurality of sections stored in the memory 400, obtain the parameter set PS based on the obtained polynomial modeling information, and perform the pre-distortion on the input signal IS based on the obtained parameter set PS.

With the device 20 according to an example embodiment of the inventive concept, since the processor 500 obtains the memory polynomial modeling information such as the auto-correlation matrix or cross-correlation vector used for obtaining the coefficient matrix based on the frequency section information FSI about the plurality of frequency sections, the amount of data to be stored by the memory 400 may be reduced. In other words, the storage space of the memory 400 used or required to perform the pre-distortion in the device 20 may be reduced.

In addition, since the device 20 is adaptively capable of performing the pre-distortion in various given frequency bands over a wide frequency band by using only a small amount of storage space in the memory 400, the reliability of the wireless communication of the device 20 may also be improved.

Figure 4:
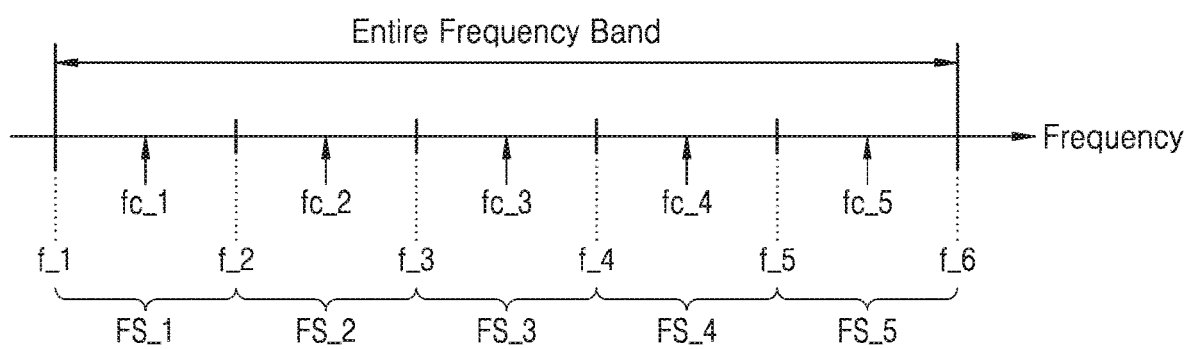
FIG. 4 illustrates a plurality of frequency sections included in the entire frequency band, according to an example embodiment of inventive concept.

FIG. 4 illustrates first through fifth frequency sections FS_1 through FS_5 included in the entire frequency band according to an example embodiment of the inventive concept. FIG. 4 is described with reference to FIG. 1.

The device 10 may operate in a particular frequency band according to a type of the device 10 or a set-up applied thereto. FIG. 4 illustrates the entire frequency band including all frequencies which the frequency band may provide. For example, the entire frequency band may include a frequency band between a first frequency f_1 and a sixth frequency f_6.

To obtain polynomial modeling information, the device 10 may divide the entire frequency band into a plurality of frequency sections (FS_1, FS_2, FS_3, FS_4, and FS_5). The number of frequency sections and respective frequency widths of the frequency sections are merely exemplary for convenience of description and are not limited to those illustrated in FIG. 4. For example, the first frequency section FS_1 may represent a frequency section between the first frequency f_1 and the second frequency f_2, and the center frequency of the first frequency section FS_1 may be a first center frequency fc_1. Similarly, the second frequency section FS_2 may represent a frequency section between the second frequency f_2 and a third frequency f_3, and a center frequency of the second frequency section FS_2 may be a second center frequency fc_2. In the same manner, the third frequency section FS_3, the fourth frequency section FS_4, and the fifth frequency section FS_5 may be understood.

In an embodiment, the first through fifth frequency sections FS_1 through FS_5 may have the same frequency width. However, the embodiment is not limited thereto, and the first through fifth frequency sections FS_1 through FS_5 may have different frequency widths from each other. For example, a frequency section near the center of the entire frequency band may have a narrower frequency width than a frequency section located near edges of the entire frequency band.

In an embodiment, the device 10 may obtain the memory polynomial modeling information for each of the plurality of frequency sections (FS_1, FS_2, FS_3, FS_4, and FS_5), and the memory 400 in the device 10 may store the memory polynomial modeling information obtained for each of the plurality of frequency sections (FS_1, FS_2, FS_3, FS_4, and FS_5) and center frequencies of each of the plurality of frequency sections (FS_1, FS_2, FS_3, FS_4, and FS_5) as the frequency section information FSI. The frequency section information FSI is described in more detail with reference to FIG. 7.

Figure 5:
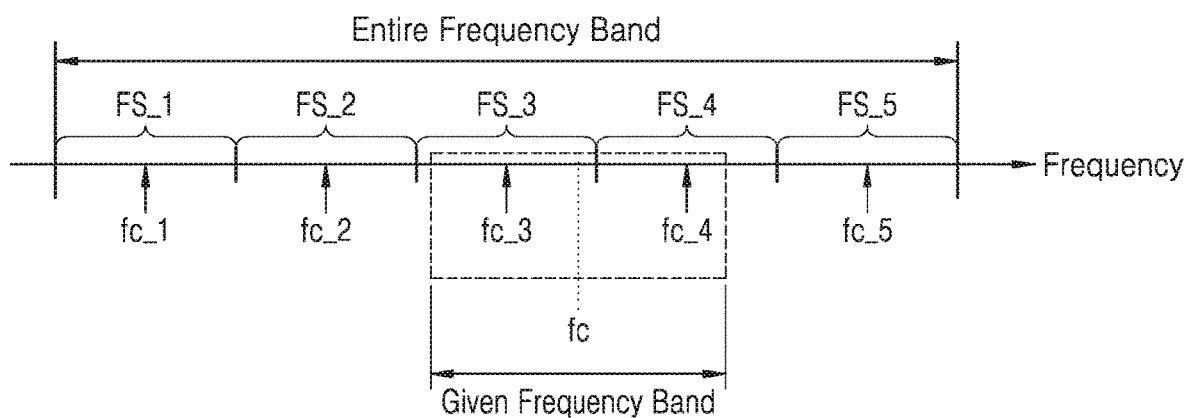
FIG. 5 illustrates an entire frequency band and a given frequency band, according to an example embodiment of the inventive concept.

FIG. 5 illustrates the entire frequency band and a given frequency band, according to an example embodiment of the inventive concept. In particular, FIG. 5 illustrates a case in which the given frequency band is a specific band within the entire frequency band divided as illustrated in FIG. 4. FIG. 5 is described below with reference to FIG. 1.

The device 10 may operate in a particular frequency band according to various factors such as the type of the device 10 or the set-up thereof, and the particular frequency band may be referred to as the given frequency band. The given frequency band may have a center frequency fc.

FIG. 5 illustrates a case in which the given frequency band spans over the third and fourth frequency section FS_3 and FS_4, but the embodiment is merely illustrative and is not limited thereto. For example, the given frequency band may span over at least one other frequency section.

In an embodiment, the parameter obtaining circuit 300 in the device 10 may determine at least one frequency band including at least a portion of the given frequency band among the plurality of frequency sections (FS_1, FS_2, FS_3, FS_4, and FS_5). For example, the parameter obtaining circuit 300 may determine that the third frequency section FS_3 and the fourth frequency section FS_4 include at least a portion of the given frequency band.

In an embodiment, the parameter obtaining circuit 300 may obtain the memory polynomial modeling information corresponding to the given frequency band based on the memory polynomial modeling information corresponding to the determined at least one frequency section. For example, the parameter obtaining circuit 300 may obtain the memory polynomial modeling information corresponding to the given frequency band, based on the memory polynomial modeling information corresponding to the third frequency section FS_3 and the memory polynomial modeling information corresponding to the fourth frequency section FS_4. Each of the memory polynomial modeling information may include an auto-correlation matrix and a cross-correlation vector that are used in a matrix equation for minimizing a difference between an intermediate signal based on the output signal OS and the pre-distorted signal PDS according to an application of the Wiener filter. For example, each of the pieces of the memory polynomial modeling information may include the auto-correlation matrix A and the cross-correlation vector b in Formula 4.

A method in which the parameter obtaining circuit 300 obtains the memory polynomial modeling information corresponding to the given frequency band is described in more detail with reference to FIG. 6.

Figure 6:
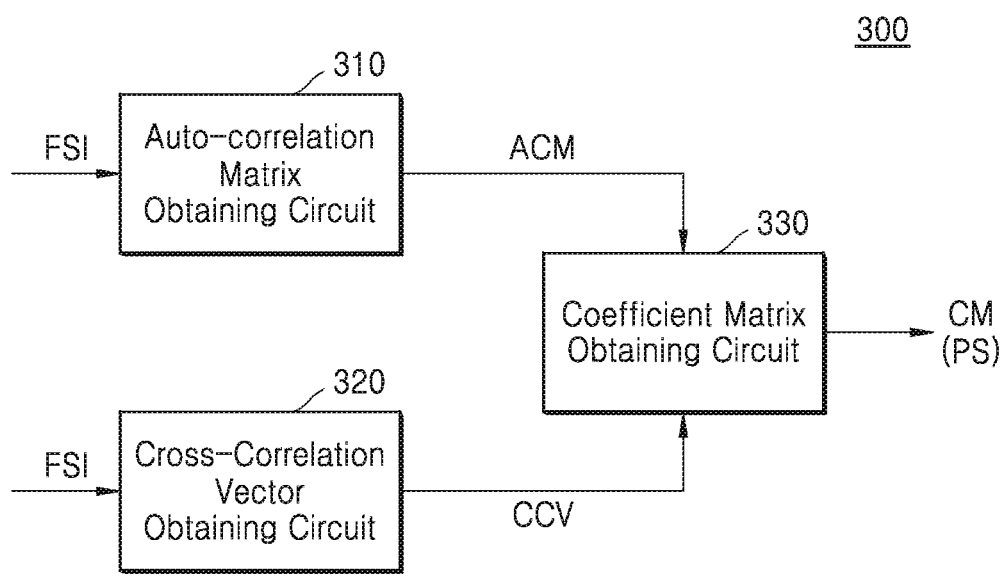
FIG. 6 is a diagram of a parameter obtaining circuit according to an example embodiment of the inventive concept.

FIG. 6 is a diagram of the parameter obtaining circuit 300 according to an example embodiment of the inventive concept. The parameter obtaining circuit 300 may correspond to the parameter obtaining circuit 300 in FIGS. 1 and 3. FIG. 6 is described with reference to FIGS. 1 and 5 together.

The parameter obtaining circuit 300 may include an auto-correlation matrix obtaining circuit 310, a cross-correlation vector obtaining circuit 320, and a coefficient matrix obtaining circuit 330.

The auto-correlation matrix obtaining circuit 310 may obtain an auto-correlation matrix ACM corresponding to the given frequency band based on the frequency section information FSI for the plurality of frequency section and provide the auto-correlation matrix ACM to the coefficient matrix obtaining circuit 330.

The cross-correlation vector obtaining circuit 320 may obtain a cross-correlation vector CCV corresponding to the given frequency band based on frequency section information FSI for the plurality of frequency sections and provide the cross-correlation vector CCV to the coefficient matrix obtaining circuit 330.

The coefficient matrix obtaining circuit 330 may obtain a coefficient matrix CM corresponding to the given frequency band, based on the auto-correlation matrix ACM corresponding to the given frequency band and the cross-correlation vector CCV corresponding to the given frequency band. For example, the coefficient matrix obtaining circuit 330 may obtain the coefficient matrix CM by performing a calculation of multiplying the cross-correlation vector CCV by an inverse matrix of the auto-correlation matrix ACM. The coefficient matrix obtaining circuit 330 may output the coefficient matrix CM as the parameter set PS.

Figure 7:
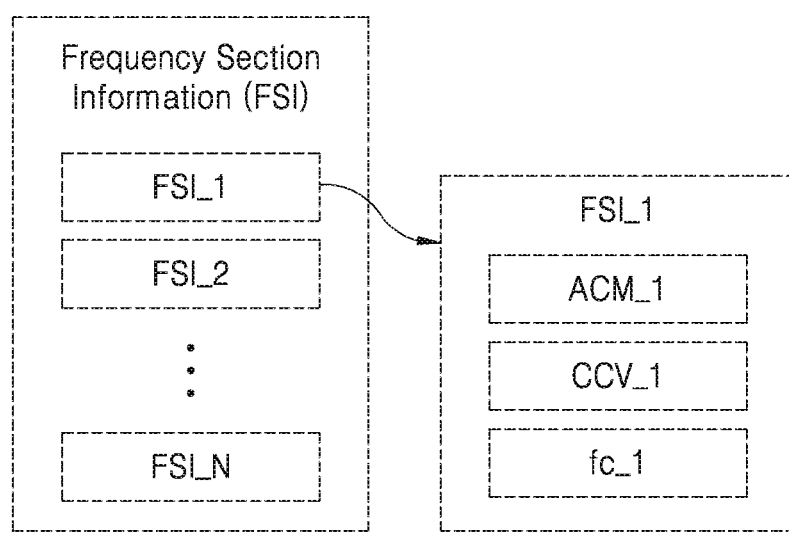
FIG. 7 illustrates a frequency section information according to an example embodiment of the inventive concept.

FIG. 7 illustrates the frequency section information FSI according to an example embodiment of the inventive concept. FIG. 7 is described with reference to FIGS. 1 and 5 together.

The frequency section information FSI may include first through Nth pieces of frequency section information FSI_1 through FSI_N (N is a natural number of two or more) corresponding to each of the plurality of frequency sections. For example, when the entire frequency band is divided into N frequency sections, the frequency section information FSI may include frequency section information corresponding to each of the N frequency sections.

The first frequency section information FSI_1 is described as a representative of the first through Nth pieces of frequency section information FSI_1 through FSI_N. The first frequency section information FSI_1 may include the memory polynomial modeling information corresponding to the first frequency section FS_1 and may include the first center frequency fc_1 of the first frequency section FS_1. The memory polynomial modeling corresponding to the first frequency section FS_1 may include a first auto-correlation matrix ACM_1 and a first cross-correlation vector CCV_1. In other words, the first frequency section information FSI_1 may include the first auto-correlation matrix ACM_1, the first cross-correlation vector CCV_1, and the first center frequency fc_1. A method of obtaining a memory polynomial modeling information corresponding to a given frequency band is described in detail with reference to the following drawings in conjunction with FIGS. 6 and 7.

Figure 8:
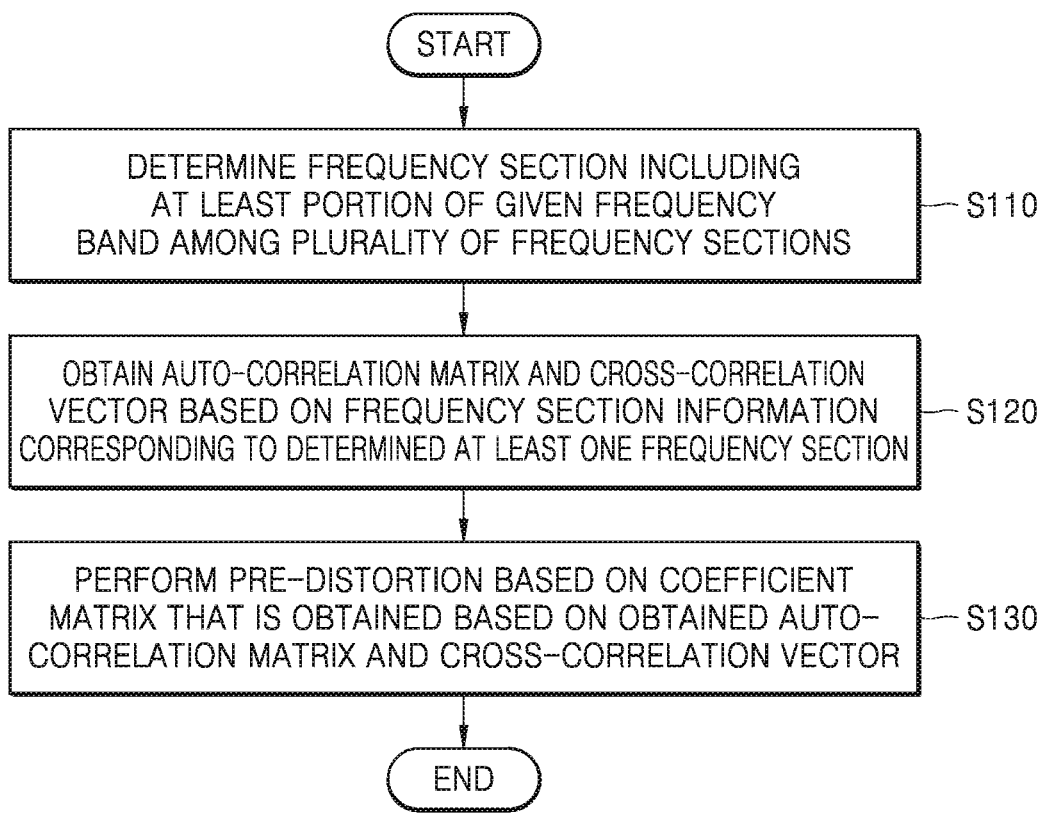
FIG. 8 is a flowchart of a signal processing method of a device, according to an example embodiment of the inventive concept.

FIG. 8 is a flowchart of a signal processing method of the device 10, according to an example embodiment of the inventive concept. FIG. 8 is described with reference to FIG. 1.

The device 10 may determine a frequency section including at least a portion of a given frequency band among the plurality of frequency sections (S110). For example, the plurality of frequency sections may, as illustrated in FIG. 4, represent frequency sections that are divided in the entire frequency band. In an embodiment, the device 10 may determine the frequency section including at least a portion of the given frequency band based on a start frequency and an end frequency of the given frequency band. For example, referring to FIG. 5 together, when the frequency band is given as illustrated in FIG. 5, the device 10 may determine that the given frequency band spans over the third frequency section FS_3 and the fourth frequency section FS_4.

The device 10 may obtain the auto-correlation matrix and the cross-correlation vector, based on the frequency section information FSI corresponding to the determined at least one frequency section (S120). In other words, the device 10 may obtain the memory polynomial modeling information corresponding to the given frequency band, based on the frequency section information FSI corresponding to the determined at least one frequency section. For example, the parameter obtaining circuit 300 in the device 10 may obtain the memory polynomial modeling information corresponding to the given frequency band, based on the memory polynomial modeling information corresponding to each of the determined at least one frequency section, the center frequency corresponding to each of the determined at least one frequency section, and the center frequency fc of the given frequency band. For example, as described in more detail below, the parameter obtaining circuit 300 may obtain the auto-correlation matrix corresponding to the given frequency band, based on the auto-correlation matrix corresponding to each of the determined at least one frequency section, the center frequency corresponding to each of the determined at least one frequency section, and the center frequency fc of the given frequency band. Similarly, the parameter obtaining circuit 300 may obtain the cross-correlation vector corresponding to the given frequency band, based on the cross-correlation vector corresponding to each of the determined at least one frequency section, the center frequency corresponding to each of the determined at least one frequency section, and the center frequency fc of the given frequency band.

The device 10 may perform the pre-distortion based on the coefficient matrix obtained based on the auto-correlation matrix and the cross-correlation vector that have been obtained in operation S120 (S130). For example, the parameter obtaining circuit 300 may obtain the coefficient matrix by performing a calculation of multiplying the cross-correlation vector corresponding to the given frequency band to an inverse matrix of the auto-correlation matrix corresponding to the given frequency band and may provide the obtained coefficient matrix to the pre-distortion circuit 100 as the parameter set PS. The pre-distortion circuit 100 may, based on the parameter set PS, generate the pre-distorted signal PDS by performing the pre-distortion on the input signal IS.

Figure 9:
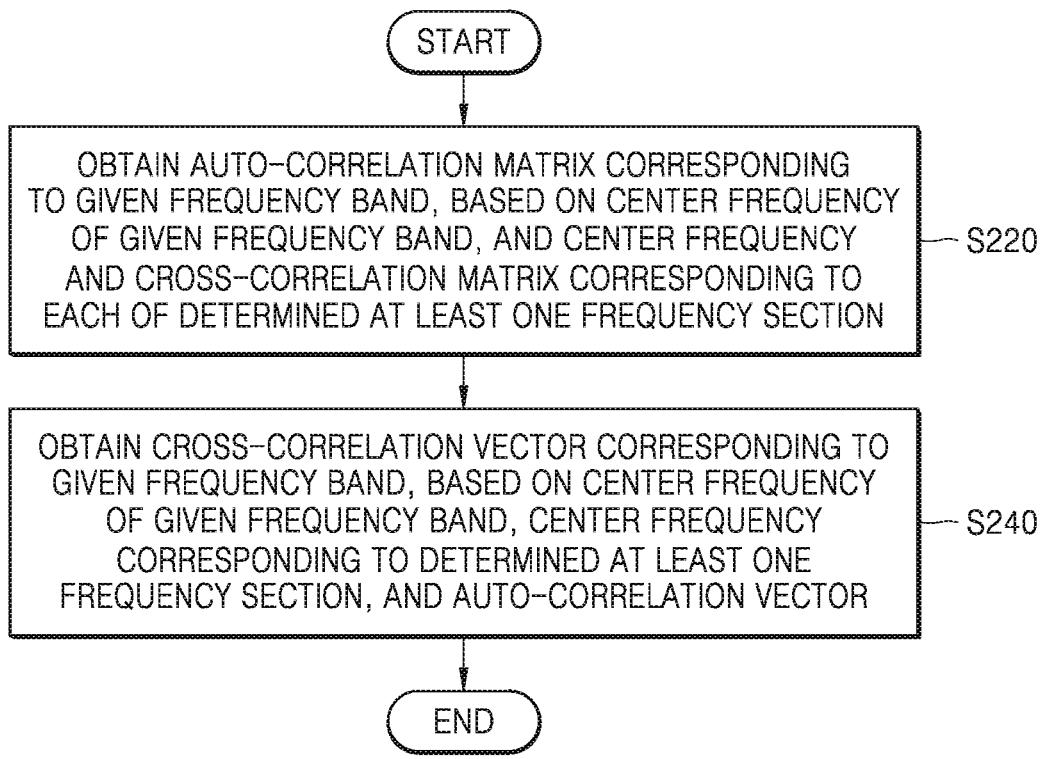
FIG. 9 is a flowchart of a signal processing method according to an example embodiment of the inventive concept.

FIG. 9 is a flowchart of a signal processing method according to an example embodiment of the inventive concept. In particular, FIG. 9 is a flowchart of example detailed operations of operation S120 in FIG. 8. FIG. 9 is described below with reference to FIG. 1.

The device 10 may obtain the auto-correlation matrix corresponding to the given frequency band, based on the center frequency fc of the given frequency band, the center frequency corresponding to the determined at least one frequency section, and the auto-correlation matrix corresponding to the determined at least one frequency section (S220). These operations (S220) may be performed by the parameter obtaining circuit 300.

The device 10 may obtain the cross-correlation vector corresponding to the given frequency band, based on the center frequency fc of the given frequency band, the center frequency corresponding to the determined at least one frequency section, and the auto-correlation vector corresponding to the determined at least one frequency section (S240). These operations (S240) may be likewise performed by the parameter obtaining circuit 300.

Figure 10:
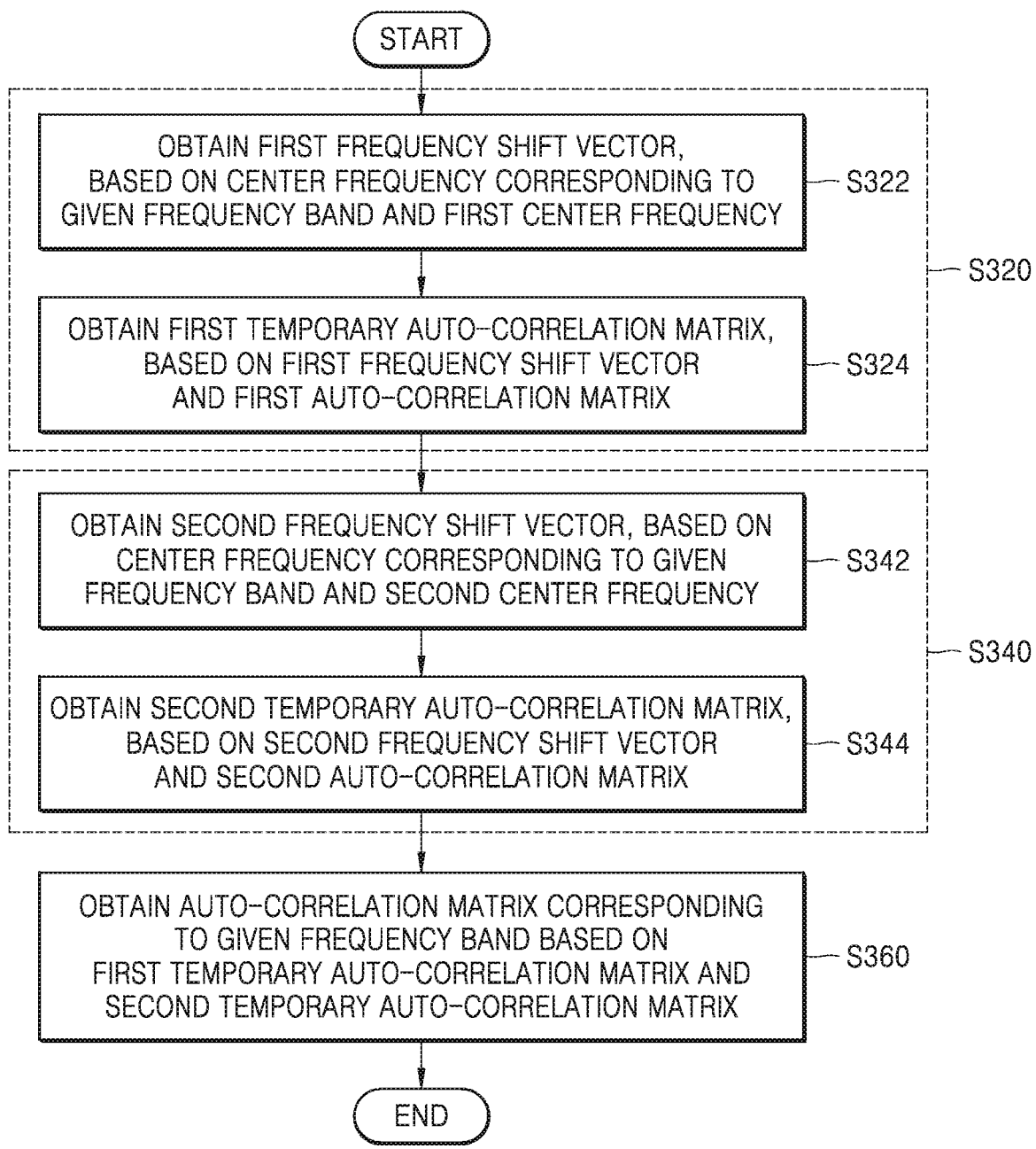
FIG. 10 is a flowchart of a signal processing method according to an example embodiment of the inventive concept.

FIG. 10 is a flowchart of a signal processing method according to an example embodiment of the inventive concept. In particular, FIG. 10 is a flowchart of example detailed operations of operation S220 in FIG. 9. FIG. 10 is described with reference to FIG. 1.

To facilitate an understanding of the inventive concepts, FIG. 10 illustrates a flowchart of a case where the determined at least one frequency section includes the first frequency section FS_1 and the second frequency section FS_2, and the given frequency band spans the first and second frequency sections FS_1 and FS_2. Each of the operations S322, S324, S342, S344 and S360 described below may be performed by the parameter obtaining circuit 300 of the device 10.

The device 10 may obtain a first frequency shift vector, based on the center frequency fc corresponding to the given frequency band and the first center frequency fc_1, which is the center frequency of the first frequency section FS_1 (S322). In an embodiment, the first frequency shift vector may be obtained by Formula 7 below. In Formula 7, $FSV_1$ represents the first frequency shift vector, fc represents the center frequency of the given frequency band, $fc_1$ represents the first center frequency, $T_1$ represents a sampling time, and K represents a memory depth.

$$FSV_1 = ee(fc - fc_1),$$

$$ee(x) = [1\ 1\ 1\ e^{2\pi \times T_1}\ e^{2\pi \times T_1}\ e^{2\pi \times T_1}\ e^{2\pi 2 \times T_1}\ \ldots\ e^{2\pi 2 \times T_1}\ \ldots\ e^{2\pi(K-1) \times T_1}]^T \quad \text{[Formula 7]}$$

In Formula 7, ee(x) may function as an intermediate function, and when Q is a nonlinear order, ee(x) may be a vector including K*Q elements. For example, ee(x) may represent a vector in which 1 is repeated for Q times, then $e^{2\pi \times T_1}$ is repeated for Q times, then $e^{2\pi 2 \times T_1}$ is repeated for Q times, and finally, $e^{2\pi(K-1) \times T_1}$ is repeated for Q times.

The device 10 may obtain a first temporary auto-correlation matrix, based on the first frequency shift vector, and the first auto-correlation matrix corresponding to the first frequency section FS_1 (S324). In an embodiment, the first temporary auto-correlation matrix may be obtained by Formula 8 below. In Formula 8, $TACM_1$ represents the first temporary auto-correlation matrix, $ACM_1$ represents the first auto-correlation matrix, and $FSV_1$ represents the first frequency shift vector.

$$TACM_1 = ACM_1 \circ (FSV_1 \cdot FSV_1^T) \quad \text{[Formula 8]}$$

In Formula 8, a matrix with T as a superscript denotes a transposed matrix. In the calculation, '•denotes a matrix multiplication, and 'o' denotes the Hadamard product calculation. The Hadamard product calculation may denote a multiplication calculation of elements corresponding to the same position in two matrices to be multiplied and may be referred to as an element-wise multiplication.

Similarly, the device 10 may obtain a second frequency shift vector, based on the center frequency fc corresponding to the given frequency band and the second center frequency fc_2, which is the center frequency of the second frequency section FS_2 (S342). In an embodiment, the second frequency shift vector may be obtained by Formula 9 below. In Formula 9, $FSV_2$ may represent the second frequency shift vector, fc may represent the center frequency of the given frequency band, $fc_2$ may represent the second center frequency, $T_1$ may represent the sampling time, and K may represent the memory depth.

$$FSV_2 = ee(fc-fc_2),$$

$$ee(x) = [1\ 1\ 1\ e^{2\pi \times T_1}\ e^{2\pi \times T_1}\ e^{2\pi \times T_1}\ e^{2\pi 2 \times T_1}\ \ldots\ e^{2\pi 2 \times T_1} \ldots e^{2\pi(K-1) \times T_1}]^T \quad \text{[Formula 9]}$$

In Formula 9, ee(x) may function as an intermediate function, and when Q is the nonlinear order, ee(x) may be the vector including K*Q elements. For example, ee(x) may represent a vector in which 1 is repeated for Q times, then $e^{2\pi \times T_1}$ is repeated for Q times, then $e^{2\pi 2 \times T_1}$ is repeated for Q times, and finally, $e^{2\pi(K-1)T_1}$ is repeated for Q times.

The device 10 may obtain a second temporary auto-correlation matrix, based on the second frequency shift vector and the second auto-correlation matrix corresponding to the second frequency section FS_2 (S344). In an embodiment, the second temporary auto-correlation matrix may be obtained by Formula 10 below. In Formula 10, $TACM_2$ may represent the second temporary auto-correlation matrix, $ACM_2$ may represent the second auto-correlation matrix, and $FSV_2$ may represent the second frequency shift vector.

$$TACM_2 = ACM_2 \circ (FSV_2 \cdot FSV_2^T) \quad \text{[Formula 10]}$$

In Formula 10, a matrix with T as a superscript may denote a transposed matrix. In the calculation, '•' may denote a matrix multiplication, and 'o' may denote the Hadamard product calculation. The Hadamard product calculation may denote a multiplication operation of elements corresponding to the same position in two matrices to be multiplied and may be referred to as an element-wise multiplication.

In other words, operation S320, which includes operations S322 and S324 and is an operation of obtaining the first temporary auto-correlation matrix, may be substantially similar to operation S340, which includes operations S342 and S344 and is an operation of obtaining the second temporary auto-correlation matrix.

The device 10 may obtain the auto-correlation matrix corresponding to the given frequency band based on the first temporary auto-correlation matrix and the second temporary auto-correlation matrix (S360), e.g., by summing the first and second temporary auto-correlation matrices. The auto-correlation matrix corresponding to the given frequency band may be obtained by Formula 11 below, in which $TACM_1$ represents the first temporary auto-correlation matrix, $TACM_2$ represents the second temporary auto-correlation matrix, ACM represents the auto-correlation matrix corresponding to the given frequency band.

$$ACM = TACM_1 + TACM_2 \quad \text{[Formula 11]}$$

Figure 11:
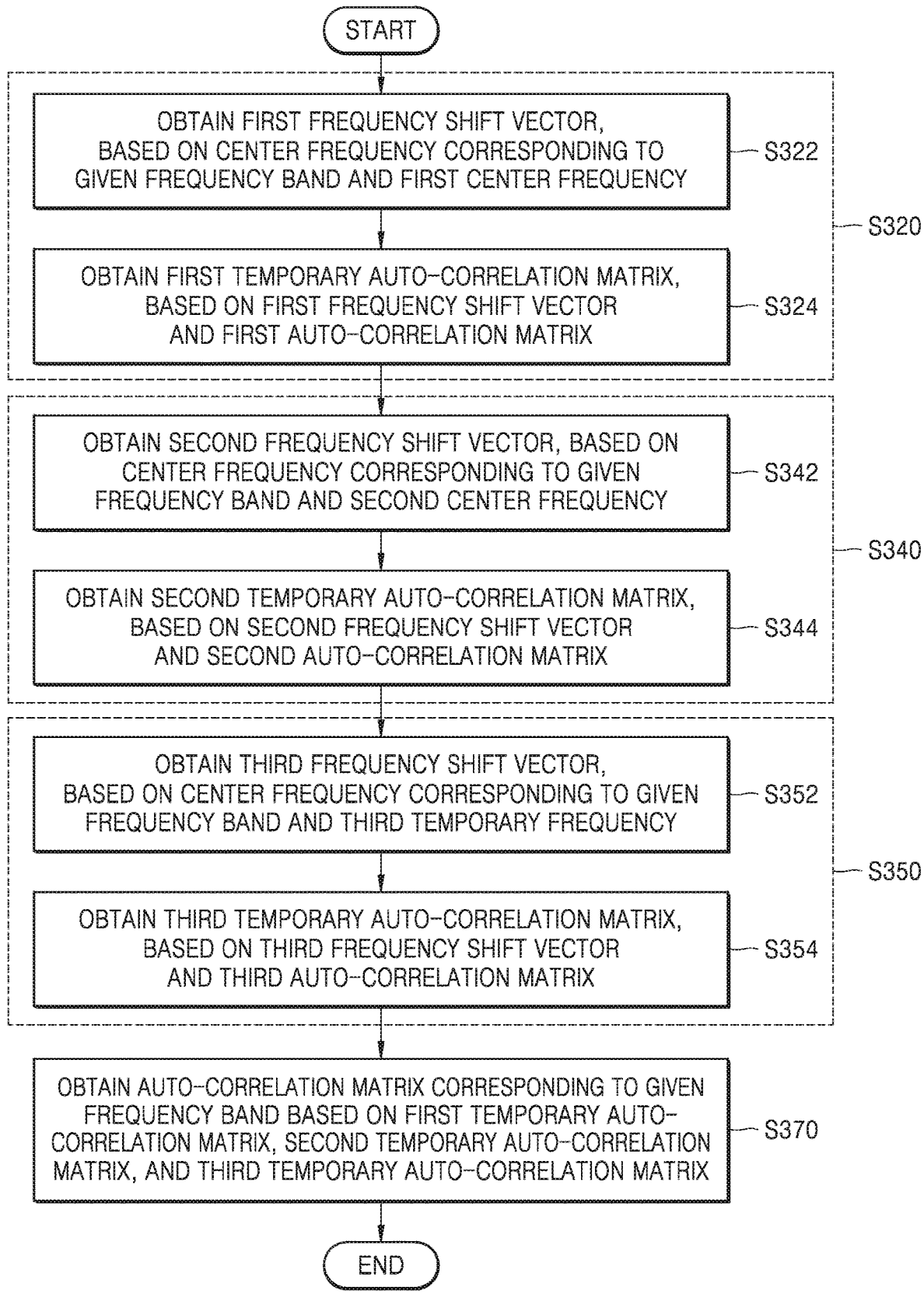
FIG. 11 is a flowchart of a signal processing method according to an example embodiment of the inventive concept.

FIG. 11 is a flowchart of a signal processing method according to an example embodiment of the inventive concept. In particular, FIG. 11 may be a flowchart of detailed operations of operation S220 in FIG. 9. FIG. 11 is described below with reference to FIG. 1.

To facilitate an understanding of the inventive concept, FIG. 11 illustrates a flowchart of a case where the determined at least one frequency section includes the first frequency section FS_1, the second frequency section FS_2, and the third frequency section FS_3.

Operation S320 in FIG. 11 may be substantially the same as operation S320 in FIG. 10, and operation S340 in FIG. 11 may be substantially the same as operation S340 in FIG. 10. In the description below, the operations S352, S354 and S370 may be performed by the parameter obtaining circuit 300 of the device 10.

The device 10 may obtain a third frequency shift vector, based on the center frequency fc corresponding to the given frequency band and a third center frequency fc_3, which is the center frequency of the third frequency section FS_3 (S352) A detailed method thereof may be similar to those of Formulas 7 and 9.

The device 10 may obtain a third temporary auto-correlation matrix, based on the third frequency shift vector and the third auto-correlation matrix corresponding to the third frequency section FS_3 (S354). A detailed method thereof may be similar to those of Formulas 8 and 10.

In other words, operation S350 including operations S352 and S354 may be substantially similar to operations S320 and S340.

The device 10 may obtain the auto-correlation matrix corresponding to the given frequency band based on the first temporary auto-correlation matrix, the second temporary auto-correlation matrix, and the third temporary auto-correlation matrix (S370), e.g., by summing the first, second and third temporary auto-correlation matrices. The auto-correlation matrix corresponding to the given frequency band may be obtained by Formula 12 below, in which $TACM_1$, $TACM_2$, and $TACM_3$ represent the first, second and third temporary auto-correlation matrices, respectively, and ACM represents the auto-correlation matrix corresponding to the given frequency band.

$$ACM = TACM_1 + TACM_2 + TACM_3 \quad \text{[Formula 12]}$$

An embodiment in which a given frequency band spans over two frequency sections is described with reference to FIG. 10, and an embodiment in which a given frequency band spans over three frequency sections is described with reference to FIG. 11. In the case of an embodiment where a given frequency band spans over four or more frequency sections, the method of obtaining an auto-correlation matrix as described with reference to FIGS. 10 and 11 may be extrapolated analogously to obtain the auto-correlation matrix using four or more temporary auto-correlation matrices.

Figure 12:
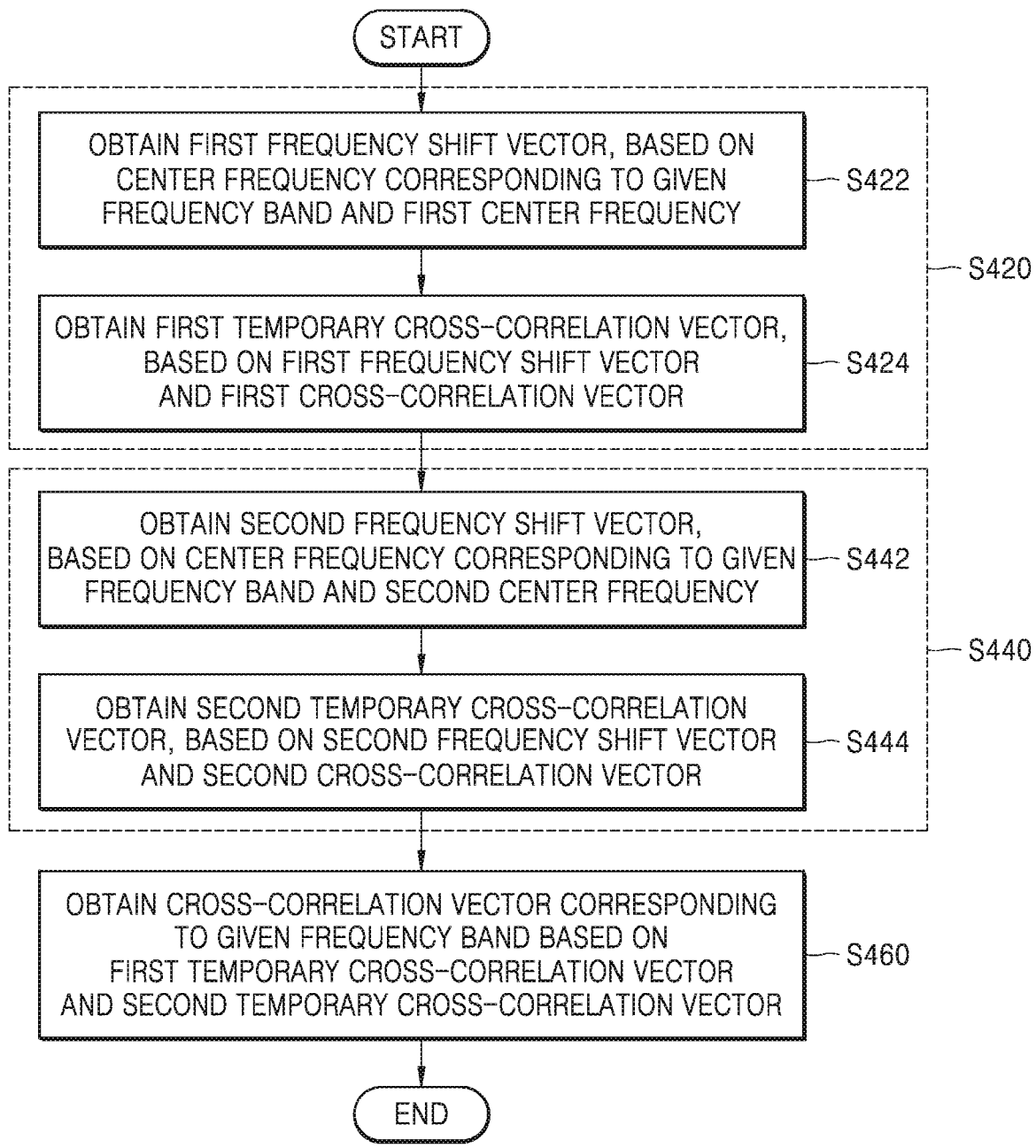
FIG. 12 is a flowchart of a signal processing method according to an example embodiment of the inventive concept.

FIG. 12 is a flowchart of a signal processing method according to an example embodiment of the inventive concept. In particular, FIG. 12 may be a flowchart of detailed operations of operation S240 in FIG. 9. FIG. 12 is described with reference to FIG. 1.

To facilitate an understanding of the inventive concept, FIG. 12 illustrates a flowchart of a case where the determined at least one frequency section includes the first frequency section FS_1 and the second frequency section FS_2. In the description below, the operations S422, S424, S442, S444 and S460 may be performed by the parameter obtaining circuit 300 of the device 10.

The device 10 may obtain a first frequency shift vector, based on the center frequency fc corresponding to the given frequency band and the first center frequency fc_1, which is the center frequency of the first frequency section FS_1 (S422). In an embodiment, the first frequency shift vector may be obtained by Formula 7 already described with reference to FIG. 10.

The device 10 may obtain the first temporary cross-correlation vector, based on the first frequency shift vector and the first cross-correlation vector corresponding to the first frequency section FS_1 (S424). In an embodiment, the first cross-correlation vector may be obtained by Formula 13 below. In Formula 13, $TCCV_1$ represents the first temporary cross-correlation matrix, $CCV_1$ represents the first cross-correlation matrix, and $FSV_1$ represents the first frequency shift vector.

$$TCCV_1 = CCV_1 \circ (FSV_1 \bullet FSV_1^T) \quad \text{[Formula 13]}$$

In Formula 13, a matrix with T as a superscript may denote a transposed matrix. In the calculation, •"•' may denote a matrix multiplication, and ∘"∘' may denote the Hadamard product calculation. The Hadamard product calculation may denote a multiplication calculation of elements corresponding to the same position in two matrices to be multiplied and may be referred to as an element-wise multiplication.

Similarly, the device 10 may obtain a second frequency shift vector, based on the center frequency fc corresponding to the given frequency band and the second center frequency fc_2, which is the center frequency of the second frequency section FS_2 (S442). In an embodiment, the second frequency shift vector may be obtained by Formula 9 already described with reference to FIG. 10.

The device 10 may obtain the second temporary cross-correlation vector, based on the second frequency shift vector and the second cross-correlation vector corresponding to the second frequency section FS_2 (S444). In an embodiment, the second cross-correlation vector may be obtained by Formula 14 below. In Formula 14, $TCCV_2$ represents the second temporary cross-correlation matrix, $CCV_2$ represents the second cross-correlation matrix, and $FSV_2$ represents the second frequency shift vector.

$$TCCV_2 = CCV_2 \circ (FSV_2 \bullet FSV_2^T) \quad \text{[Formula 14]}$$

In Formula 14, a matrix with T as a superscript denotes a transposed matrix. In the calculation, "•" may denote a matrix multiplication, and "∘" may denote the Hadamard product calculation. The Hadamard product calculation may denote a multiplication calculation of elements corresponding to the same position in two matrices to be multiplied and may be referred to as an element-wise multiplication.

In other words, operation S420, which includes operations S422 and S424 and is an operation of obtaining the first temporary cross-correlation vector, may be substantially similar to operation S440, which includes operations S442 and S444 and is an operation of obtaining the second temporary cross-correlation vector.

The device 10 may obtain the cross-correlation vector corresponding to the given frequency band based on the first temporary cross-correlation vector and the second temporary cross-correlation vector (S460), e.g., by summing the first and second temporary cross-correlation vectors. The cross-correlation vector corresponding to the given frequency band may be obtained by Formula 15 below. Here, $TCCV_1$ represents the first temporary cross-correlation vector, $TCCV_2$ represents the second temporary cross-correlation vector, and CCV represents the cross-correlation vector corresponding to the given frequency band.

$$CCV = TCCV_1 + TCCV_2 \quad \text{[Formula 15]}$$

Referring to the descriptions given with reference to FIG. 12, a method of obtaining a cross-correlation vector may be implemented in an analogous, extrapolated manner as an embodiment in which a given frequency band spans over three or more frequency sections.

Figure 13:
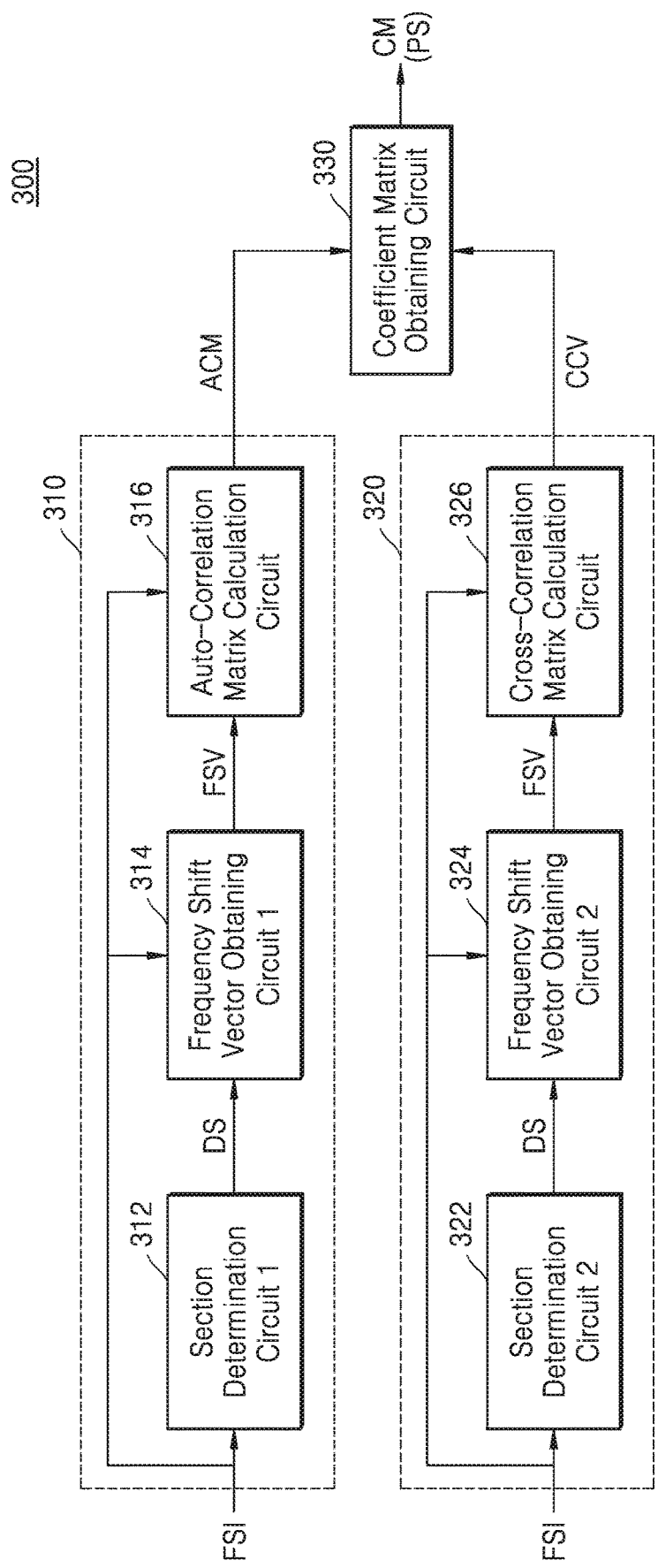
FIG. 13 is a parameter obtaining circuit according to an example embodiment of the inventive concept.

FIG. 13 is a diagram of the parameter obtaining circuit 300 according to an example embodiment of the inventive concept.

The parameter obtaining circuit 300 may include the auto-correlation matrix obtaining circuit 310, the cross-correlation vector obtaining circuit 320, and the coefficient matrix obtaining circuit 330. Descriptions of the auto-correlation matrix obtaining circuit 310, the cross-correlation vector obtaining circuit 320, and the coefficient matrix obtaining circuit 330 are already given with respect to FIG. 6, and thus redundant description thereof is omitted.

The auto-correlation matrix obtaining circuit 310 may include a first section determination circuit 312, a first frequency shift vector obtaining circuit 314, and an auto-correlation matrix calculation circuit 316.

The first section determination circuit 312 may determine at least one frequency section including at least a portion of the given frequency band among the plurality of frequency sections. The first section determination circuit 312 may provide a determined section information DS to the first frequency shift vector obtaining circuit 314.

The first frequency shift vector obtaining circuit 314 may, based on the determined section information DS, select frequency section information FSI corresponding to at least one frequency section determined among pieces of the frequency section information FSI, and may generate a frequency shift vector FSV based on the frequency section information FSI corresponding to the determined at least one frequency section. For example, the first frequency shift vector obtaining circuit 314 may generate the frequency shift vector FSV according to Formula 7 described with respect to FIG. 10.

The auto-correlation matrix calculation circuit 316 may obtain the auto-correlation matrix ACM corresponding to a given frequency band based on the frequency shift vector FSV. For example, when the given frequency band spans over the first frequency section and the second frequency section, the auto-correlation matrix calculation circuit 316 may, based on the frequency shift vector FSV, obtain the auto-correlation matrix ACM corresponding to the given frequency band by using the same method as those in operations S324, S344, and S360 in FIG. 10.

The cross-correlation matrix obtaining circuit 320 may include a second section determination circuit 322, a second frequency shift vector obtaining circuit 324, and a cross-correlation matrix calculation circuit 326.

The second section determination circuit 322 may determine at least one frequency section including at least a portion of the given frequency band among the plurality of frequency sections. The second section determination circuit 322 may provide the determined section information DS to the second frequency shift vector obtaining circuit 324.

The second frequency shift vector obtaining circuit 324 may, based on the determined section information DS, select the frequency section information FSI corresponding to at least one frequency section determined among the frequency section information FSI, and may generate the frequency shift vector FSV based on the frequency section information FSI corresponding to the determined at least one frequency section. For example, the second frequency shift vector obtaining circuit 324 may generate the frequency shift vector FSV according to Formula 7 described with respect to FIG. 10.

The cross-correlation matrix calculation circuit 326 may obtain the cross-correlation matrix ACM corresponding to the given frequency band based on the frequency shift vector FSV. For example, when the given frequency band spans over the first frequency section and the second frequency section, the cross-correlation matrix calculation circuit 326 may, based on the frequency shift vector FSV, obtain the cross-correlation vector CCV corresponding to the given frequency band by using the same method as those in operations S424, S444, and S460 in FIG. 12.

Figure 14:
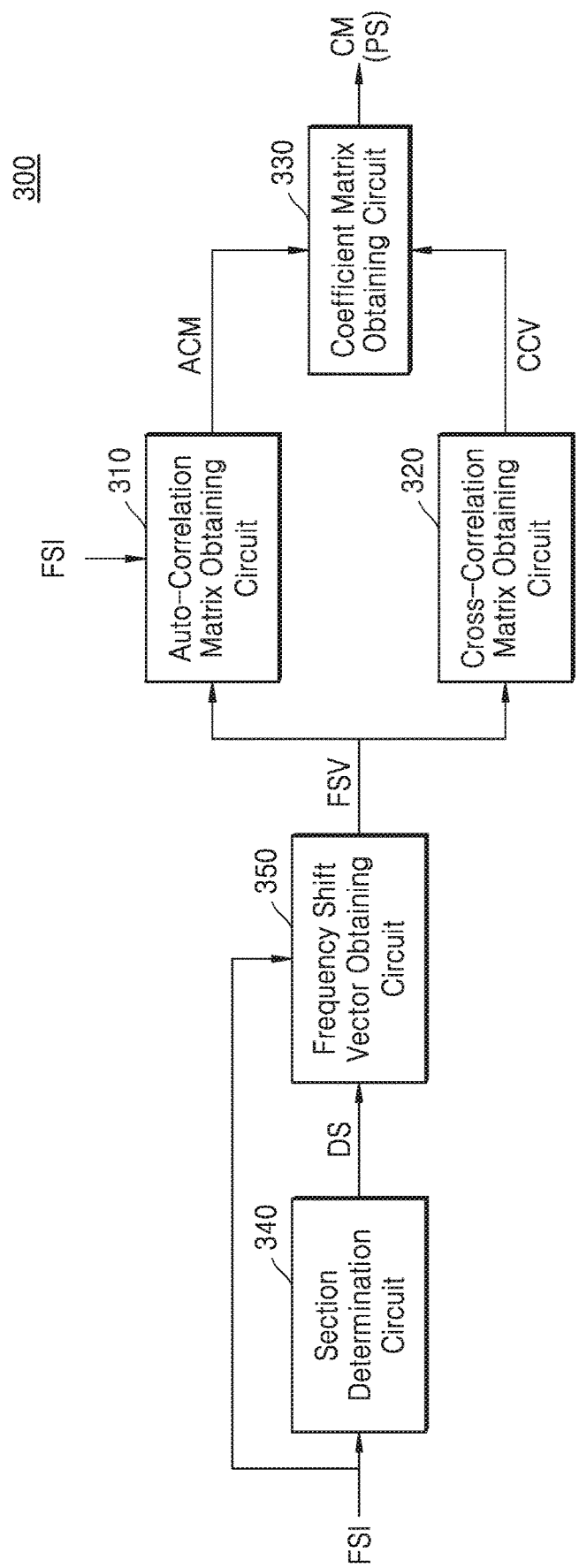
FIG. 14 is a parameter obtaining circuit according to an example embodiment of the inventive concept.

FIG. 14 is a diagram of the parameter obtaining circuit 300 according to an example embodiment of the inventive concept. In particular, FIG. 14 illustrates another implementation of the parameter obtaining circuit 300. FIG. 14 illustrates an embodiment in which a section determination circuit 340 and a frequency shift vector obtaining circuit 350 are shared as an implementation example of FIG. 13.

The parameter obtaining circuit 300 may include the auto-correlation matrix obtaining circuit 310, the cross-correlation vector obtaining circuit 320, the coefficient matrix obtaining circuit 330, the section determination circuit 340, and the frequency shift vector obtaining circuit 350. Descriptions of the auto-correlation matrix obtaining circuit 310, the cross-correlation vector obtaining circuit 320, and the coefficient matrix obtaining circuit 330 already given with respect to FIG. 6 are omitted.

The section determination circuit 340 may have substantially the same function as the first section determination circuit 312 and the second section determination circuit 322 in FIG. 13. In other words, the section determination circuit 340 may determine at least one frequency section including at least a portion of the given frequency band among the plurality of frequency sections. The section determination circuit 340 may provide the determined section information DS to the frequency shift vector obtaining circuit 350.

The frequency shift vector obtaining circuit 350 may have a substantially identical function to the first frequency shift vector obtaining circuit 314 and the second frequency shift vector obtaining circuit 324 in FIG. 13.

The auto-correlation matrix obtaining circuit 310 in FIG. 14 may have a substantially identical function to the auto-correlation matrix calculation circuit 316 in FIG. 13, and the cross-correlation vector obtaining circuit 320 in FIG. 14 may have a substantially identical function to the cross-correlation matrix calculation circuit 326 in FIG. 13.

Figure 15:
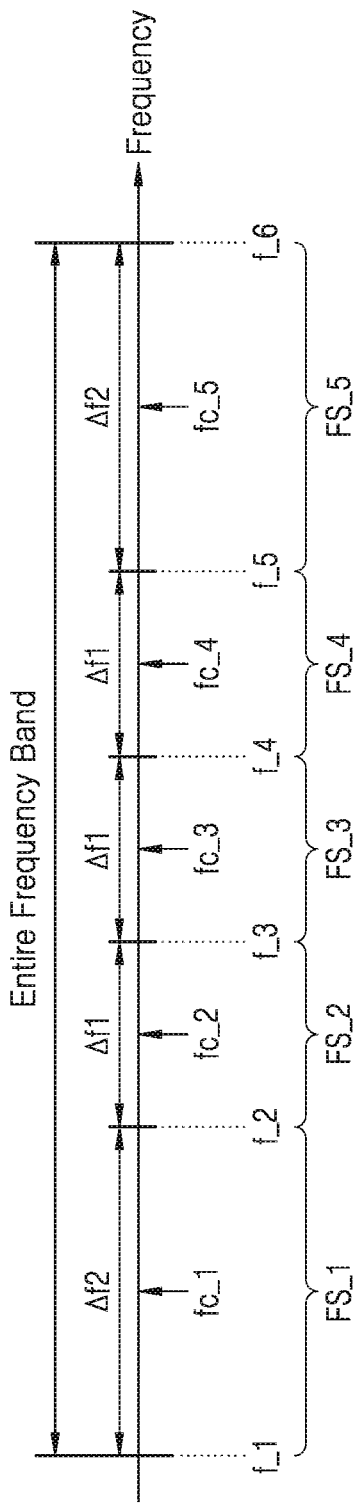
FIG. 15 illustrates an entire frequency band and a plurality of frequency sections, according to an example embodiment of inventive concept.

FIG. 15 illustrates the entire frequency band and the plurality of frequency sections (FS_1, FS_2, FS_3, FS_4, and FS_5), according to an example embodiment of the inventive concept. Referring to FIG. 15, unlike FIG. 4, a frequency width of each of the plurality of frequency sections (FS_1, FS_2, FS_3, FS_4, and FS_5) may not be identical.

For example, a frequency width of a frequency section near the center of the entire frequency band may be less than those of frequency sections near edges of the entire frequency band.

For example, frequency widths of the second frequency section FS_2, the third frequency section FS_3, and the fourth frequency section FS_4 may represent a first frequency width $\Delta f1$, and frequency widths of the first frequency section FS_1 and the fifth frequency section FS_5 near edges of the entire frequency band may represent a second frequency width $\Delta f2$. In an embodiment, the first frequency width $\Delta f1$ may be less than the second frequency width $\Delta f2$.

Figure 16:
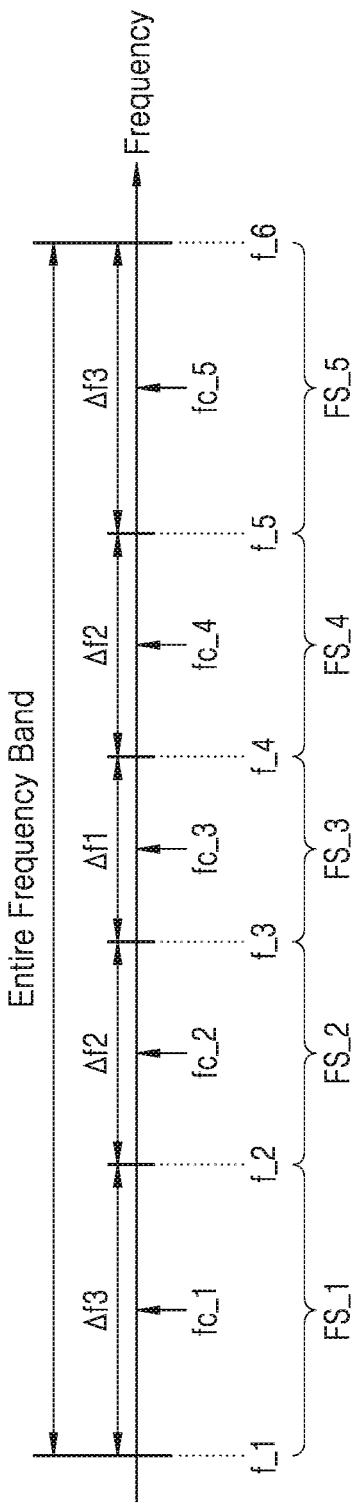
FIG. 16 illustrates an entire frequency band and a plurality of frequency sections, according to an example embodiment of inventive concept.

FIG. 16 illustrates the entire frequency band and the plurality of frequency sections (FS_1, FS_2, FS_3, FS_4, and FS_5), according to an example embodiment of the inventive concept. Referring to FIG. 16, unlike FIG. 4, frequency widths of the plurality of frequency sections (FS_1, FS_2, FS_3, FS_4, and FS_5) may not be identical to each other.

For example, the frequency width of the third frequency section FS_3 may be the first frequency width $\Delta f1$, and the frequency widths of the second frequency section FS_2 and the fourth frequency section FS_4 may be the second frequency width $\Delta f2$, and the frequency widths of the first frequency section FS_1 and the fifth frequency section FS_5 may be the third frequency width $\Delta f3$. The first frequency width $\Delta f1$ may be less than the second frequency width $\Delta f2$, and the second frequency width $\Delta f2$ may be less than the third frequency width $\Delta f3$.

Figure 17:
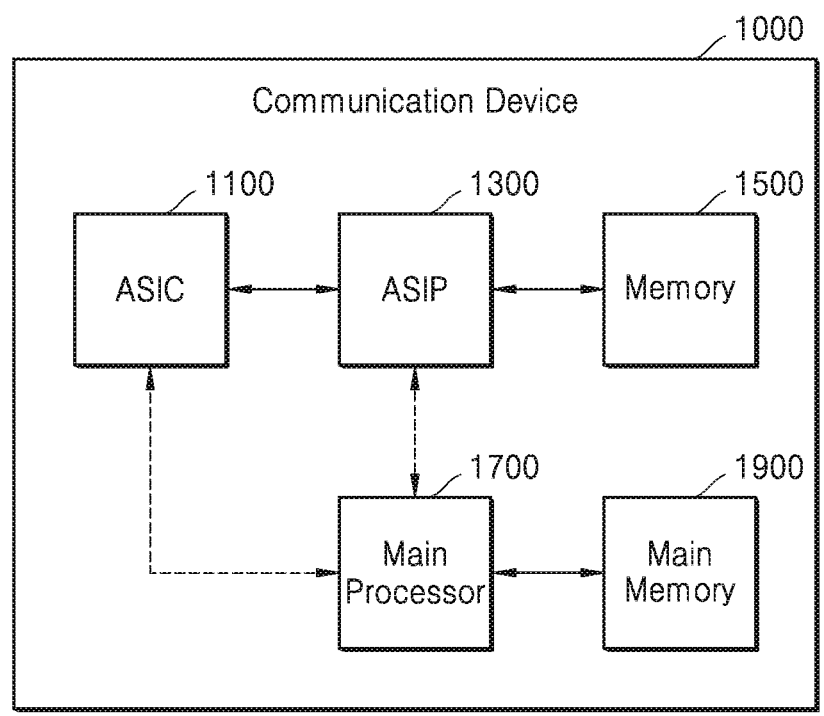
FIG. 17 illustrates a communication device according to an example embodiment of the inventive concept.

FIG. 17 illustrates a communication device 1000 according to an example embodiment of the inventive concept. As illustrated in FIG. 14, the communication device 1000 may include an application specific integrated circuit (ASIC) 1100, an application specific instruction set processor (ASIP) 1300, a memory 1500, a main processor 1700, and a main memory 1900. Two or more of the ASIC 1100, the ASIP 1300, and the main processor 1700 may communicate with each other. In addition, at least two or more of the ASIC 1100, the ASIP 1300, the memory 1500, the main processor 1700, and the main memory 1900 may be embedded in one chip.

The ASIP 1300 may include an integrated circuit customized for a particular usage, support a dedicated instruction set for a particular application, and execute instructions contained in the dedicated instruction set. The memory 1500 may communicate with the ASIP 1300, and may store, as a non-volatile storage, a plurality of instructions executed by the ASIP 1300. For example, the memory 1500 may include an arbitrary type memory accessible by the ASIP 1300, as a non-limited example, such as random access memory (RAM), read-only memory (ROM), a tape, a magnetic disk, an optical disk, a volatile memory, a non-volatile memory, and a combination thereof.

The main processor 1700 may control the communication device 1000 by executing a plurality of instructions. For example, the main processor 1700 may control the ASIC 1100 and the ASIP 1300, and process data received via the MIMO channel, or process a user input to the communication device 1000. The main memory 1900 may communicate with the main processor 1700, and may store, as a non-volatile storage, the plurality of instructions executed by main processor 1700. For example, the main memory 1900 may include an arbitrary type memory accessible by the main processor 1700, as a non-limited example, such as RAM, ROM, a tape, a magnetic disk, an optical disk, a volatile memory, a non-volatile memory, and a combination thereof.

An above-described method of compensating non-linearity of the transmitter according to an example embodiment of the inventive concept may be performed by at least one of the components included in the communication device 1000 in FIG. 17. For example, the processor 500 described above may be included in at least one of the ASIC 1100, the ASIP 1300, the memory 1500, the main processor 1700, and the main memory 1900 in FIG. 17. In some embodiments, at least one of the operations of the above-described method of compensating the non-linearity of the transmitter 200 may be implemented as a plurality of instructions stored in memory 1500. In some embodiments, the ASIP 1300 may perform at least one of the operations of the method of compensating the non-linearity of the transmitter 200 by executing the plurality of instructions stored in the memory 1500. In some embodiments, at least one of the operations of the method of compensating the non-linearity of the transmitter 200 may be implemented in a hardware block designed by using logic synthesis or the like and be included in the ASIC 1100. In some embodiments, at least one of the operations of the method compensating the non-linearity of the power amplifier 200 may be implemented as a plurality of instructions stored in the main memory 1900, and the main processor 1700 may perform the at least one of the operations the method compensating the non-linearity of the power amplifier 200 by executing the plurality of instructions stored in the main memory 1900.

While the inventive concept has been particularly shown and described with reference to embodiments thereof, it will be understood that various changes in form and details may be made therein without departing from the spirit and scope of the following claims. For instance, while the inventive concept has been particularly shown and described in connection with a wireless communication application, it may be applied to correcting for nonlinearity in wired communication systems in other examples.

What is claimed is:

1. A method of performing a pre-distortion calculation on an input signal of a frequency band spanning over a first frequency section and a second frequency section, performed by a device, the method comprising:
    obtaining a first matrix corresponding to the first frequency section, a second matrix corresponding to the second frequency section, and a matrix corresponding to the frequency band based on a center frequency of the frequency band;
    obtaining a first vector corresponding to the first frequency section, a second vector corresponding to the second frequency section, and a third vector corresponding to the frequency band based on the center frequency of the frequency band; and
    performing pre-distortion on the input signal by using a coefficient matrix obtained based on the obtained matrix corresponding to the frequency band and the obtained third vector,
    wherein the obtaining of the matrix corresponding to the frequency band comprises:
    obtaining a first temporary matrix based on a first center frequency in the first frequency section, the center frequency of the frequency band, and the first matrix;
    obtaining a second temporary matrix based on a second center frequency in the second frequency section, the center frequency of the frequency band, and the second matrix; and
    obtaining the matrix corresponding to the frequency band by performing a calculation of summing the first temporary matrix and the second temporary matrix.

2. The method of claim 1,
    wherein the obtaining of the first temporary matrix comprises:
    generating a first frequency shift vector based on the first center frequency and the center frequency of the frequency band; and
    obtaining the first temporary matrix based on the first frequency shift vector and the first matrix,
    wherein the obtaining of the second temporary matrix comprises:
    generating a second frequency shift vector based on the second center frequency and the center frequency of the frequency band; and
    obtaining the second temporary matrix based on the second frequency shift vector and the second matrix.

3. The method of claim 2, wherein,
    the obtaining of the first temporary matrix based on the first frequency shift vector and the first matrix comprises:
    obtaining a resultant matrix by performing a vector multiplication by using the first frequency shift vector and a transposed first frequency shift vector; and
    obtaining the first matrix by performing the Hadamard multiplication calculation by using the first matrix and the resultant matrix.

4. A method of performing a pre-distortion calculation on an input signal of a frequency band spanning over a first frequency section and a second frequency section, performed by a device, the method comprising:
    obtaining a first matrix corresponding to the first frequency section, a second matrix corresponding to the second frequency section, and a matrix corresponding to the frequency band based on a center frequency of the frequency band;
    obtaining a first vector corresponding to the first frequency section, a second vector corresponding to the second frequency section, and a third vector corresponding to the frequency band based on the center frequency of the frequency band; and
    performing pre-distortion on the input signal by using a coefficient matrix obtained based on the obtained matrix corresponding to the frequency band and the obtained third vector,
    wherein obtaining of the third vector corresponding to the frequency band comprises:
    obtaining a first temporary vector based on a first center frequency in the first frequency section, the center frequency of the frequency band, and the first vector;
    obtaining a second temporary vector based on a second center frequency in the second frequency section, the center frequency of the frequency band, and the second vector; and
    obtaining the third vector corresponding to the frequency band by performing a calculation of summing the first temporary vector and the second temporary vector.

5. The method of claim 4,
    wherein the obtaining of the first temporary vector comprises:
    generating a first frequency shift vector based on the first center frequency and the center frequency of the frequency band; and
    obtaining the first temporary vector based on the first frequency shift vector and the first vector, and
    the obtaining of the second temporary vector comprises:
    generating a second frequency shift vector based on the second center frequency and the center frequency of the frequency band; and
    obtaining the second temporary vector based on the second frequency shift vector and the second vector.

6. The method of claim 5,
    wherein the obtaining of the first temporary vector based on the first frequency shift vector and the first vector comprises:

obtaining a resultant matrix by performing a vector multiplication by using the first frequency shift vector and a transposed first frequency shift vector; and obtaining the first vector by performing the Hadamard multiplication calculation by using the first vector and the resultant matrix.

7. A device configured to perform wireless communication, the device comprising:

a memory configured to store a plurality of pieces of frequency section information for each of a plurality of frequency sections divided in an entire frequency band over which the device is configured to operate;

a processor configured to generate a pre-distorted input signal by performing pre-distortion on an input signal in a given frequency band; and an amplifier configured to generate an output signal based on the pre-distorted input signal provided by the processor, wherein the processor is configured to, when the given frequency band spans over a first frequency section and a second frequency section among the plurality of frequency sections, perform the pre-distortion on the input signal by using a coefficient matrix obtained based on first frequency section information corresponding to the first frequency section and second frequency section information corresponding to the second frequency section, and when the given frequency band spans over a third frequency section and a fourth frequency section among the plurality of frequency sections, perform the pre-distortion on the input signal by using a coefficient matrix obtained based on third frequency section information corresponding to the third frequency section and fourth frequency section information corresponding to the fourth frequency section, wherein the first frequency section information comprises a first matrix corresponding to the first frequency section, a first vector corresponding to the first frequency section, and a first center frequency of the first frequency section, the second frequency section information comprises a second matrix corresponding to the second frequency section, a second vector corresponding to the second frequency section, and a second center frequency of the second frequency section, and the processor is configured to, when the given frequency band spans over the first frequency section and the second frequency section, obtain the coefficient matrix based on a vector obtained based on a matrix that is obtained based on the first matrix, the second matrix, and a center frequency of the given frequency band, and a matrix that is obtained based on the first vector, the second vector, and the center frequency of the given frequency band.

8. The device of claim 7, wherein the processor is configured to, when the given frequency band spans over the first frequency section and the second frequency section, obtain a first temporary matrix based on the first center frequency, the center frequency of the given frequency band, and the first matrix, obtain a second temporary matrix based on the second center frequency, the center frequency of the given frequency band, and the second matrix, and obtain the matrix by performing a calculation by using the first temporary matrix and the second temporary matrix.

9. The device of claim 8, wherein the processor is configured to, when the given frequency band spans over the first frequency section and the second frequency section, generate a first frequency shift vector based on the first center frequency and the center frequency of the given frequency band, obtain a first temporary matrix based on the first frequency shift vector and the first matrix, generate a second frequency shift vector based on the second center frequency and the center frequency of the given frequency band, and obtain the second temporary matrix based on the second frequency shift vector and the second matrix.

10. The device of claim 7, wherein the processor is configured to, when the given frequency band spans over the first frequency section and the second frequency section, obtain a first temporary matrix vector based on the first center frequency, the center frequency of the given frequency band, and the first vector, obtain a second temporary vector based on the second center frequency, the center frequency of the given frequency band, and the second vector, and obtain a third vector by performing a calculation by using the first temporary vector and the second temporary vector.

11. The device of claim 10, wherein the processor is configured to, when the given frequency band spans over the first frequency section and the second frequency section, generate a first frequency shift vector based on the first center frequency and the center frequency of the given frequency band, obtain a first temporary vector based on the first frequency shift vector and the first vector, generate a second frequency shift vector based on the second center frequency and the center frequency of the given frequency band, and obtain the second temporary vector based on the second frequency shift vector and the second vector.

12. A device configured to perform wireless communication, the device comprising:

a memory configured to store a plurality of pieces of memory polynomial modeling information corresponding to each of a plurality of frequency sections divided in an entire frequency band over which the device is configured to operate, wherein each of the pieces of memory polynomial modeling information is information obtained by modeling using a polynomial; and a processor configured to obtain second memory polynomial modeling information corresponding to an operating frequency band by using at least one piece of first memory polynomial modeling information corresponding to at least one first frequency section comprising at least a portion of the operating frequency band of the plurality of frequency sections among the plurality of pieces of memory polynomial modeling information, and generate a pre-distorted input signal by performing pre-distortion on an input signal by using a parameter set obtained by using the second memory polynomial modeling information.

13. The device of claim 12, wherein each of the plurality of memory polynomial modeling information comprises, according to an application of a Wiener filter, an auto-correlation matrix and a vector used in a matrix equation used for reducing a magnitude of an error signal according to an indirect learning structure.

14. The device of claim 13,
wherein the processor is configured to
generate at least one frequency shift vector based on a center frequency corresponding to each of the at least one first frequency section and a center frequency of the operating frequency band and obtain an auto-correlation matrix corresponding to the operating frequency band based on an auto-correlation matrix corresponding to the at least one first frequency section and the at least one frequency shift vector.

15. The device of claim 13,
wherein the processor is configured to,
when the operating frequency band comprises a third frequency section and a fourth frequency section among the plurality of frequency sections, generate a first frequency shift vector based on a first center frequency corresponding to the third frequency section and a center frequency of the operating frequency band, and obtain a first temporary auto-correlation matrix based on the first frequency shift vector and a first auto-correlation matrix corresponding to the third frequency section,
generate a second frequency shift vector based on a second center frequency corresponding to the fourth frequency section and the center frequency of the operating frequency band, and obtain a second temporary auto-correlation matrix based on the second frequency shift vector and a second auto-correlation matrix corresponding to the fourth frequency section, and
obtain an auto-correlation matrix corresponding to the operating frequency band by performing a calculation by using the first temporary auto-correlation matrix and the second temporary auto-correlation matrix.

16. The device of claim 13, wherein the processor is configured to generate at least one frequency shift vector based on a center frequency corresponding to each of the at least one first frequency section and a center frequency of the operating frequency band and obtain a vector corresponding to the operating frequency band based on a vector corresponding to the at least one first frequency section and the at least one frequency shift vector.

17. The device of claim 16, wherein the processor is configured to,
when the operating frequency band comprises a third frequency section and a fourth frequency section among the plurality of frequency sections, generate a first frequency shift vector based on a first center frequency corresponding to the third frequency section and a center frequency of the operating frequency band, and obtain a first temporary vector based on the first frequency shift vector and a first vector corresponding to the third frequency section,
generate a second frequency shift vector based on a second center frequency corresponding to the fourth frequency section and the center frequency of the operating frequency band, and obtain a second temporary vector based on the second frequency shift vector and a second vector corresponding to the fourth frequency section; and
obtain a vector corresponding to the operating frequency band by performing a calculation by using the first temporary vector and the second temporary vector.

18. The device of claim 12, wherein the plurality of frequency sections have identical frequency widths to each other, or
a frequency width of a center frequency section comprising a center frequency of the entire frequency band, among the plurality of frequency sections is less than a width of an edge frequency section comprising a maximum frequency or a minimum frequency of the entire frequency band.

* * * * *